United States Patent
Kumar et al.

(10) Patent No.: US 12,126,355 B2
(45) Date of Patent: Oct. 22, 2024

(54) LINEARITY AND/OR GAIN IN MIXED-SIGNAL CIRCUITRY

(71) Applicant: Socionext Inc., Kanagawa (JP)

(72) Inventors: Jayaraman Kumar, Maidenhead (GB); Kenneth Stephen Hunt, Maidenhead (GB)

(73) Assignee: SOCIONEXT INC., Kanagawa (JP)

( * ) Notice: Subject to any disclaimer, the term of this patent is extended or adjusted under 35 U.S.C. 154(b) by 152 days.

(21) Appl. No.: 17/859,658

(22) Filed: Jul. 7, 2022

(65) Prior Publication Data
US 2023/0034555 A1 Feb. 2, 2023

(30) Foreign Application Priority Data

Jul. 28, 2021 (EP) .................................... 21188220

(51) Int. Cl.
| | | |
|---|---|---|
| *H03M 1/66* | (2006.01) | |
| *H03M 1/38* | (2006.01) | |
| *H03M 1/06* | (2006.01) | |
| *H03M 1/12* | (2006.01) | |

(52) U.S. Cl.
CPC ............ *H03M 1/66* (2013.01); *H03M 1/38* (2013.01); *H03M 1/0604* (2013.01); *H03M 1/12* (2013.01)

(58) Field of Classification Search
CPC ............ H03M 1/66; H03M 1/38; H03M 1/12; H03M 1/0604
See application file for complete search history.

(56) References Cited

U.S. PATENT DOCUMENTS

| | | |
|---|---|---|
| 8,547,270 B1 | 10/2013 | Strode |
| 8,766,833 B1 | 7/2014 | Bogner |
| 9,287,891 B1 | 3/2016 | Lee et al. |
| 9,397,679 B1 | 7/2016 | Harpe |
| 9,425,811 B1 | 8/2016 | Mandal |
| 10,938,402 B1 | 3/2021 | Hsu et al. |

(Continued)

FOREIGN PATENT DOCUMENTS

EP   2211468 A1   7/2010

OTHER PUBLICATIONS

Extended European Search Report dated Jan. 21, 2022 issued in the corresponding European Patent Application No. 21188220.4.

(Continued)

*Primary Examiner* — Joseph J Lauture
(74) *Attorney, Agent, or Firm* — Rimon P.C.

(57) ABSTRACT

Mixed-signal circuitry including a set of capacitive digital-to-analogue converter, CDAC, units for carrying out digital-to-analogue conversion operations to convert respective digital values into corresponding analogue values; and control circuitry, where: each CDAC unit includes an array of capacitors at least some of which are configured to be individually-switched dependent on the digital values, the capacitors configured to have nominal capacitances; a given capacitor of the array of capacitors in each of the CDAC units is a target capacitor; the set of CDAC units includes a plurality of sub-sets of CDAC units; at least one of the target capacitors per sub-set of CDAC units is a variable capacitor, controllable by the control circuitry to have any one of a plurality of nominal capacitances defined by the configuration of that capacitor.

17 Claims, 20 Drawing Sheets

(56) References Cited

U.S. PATENT DOCUMENTS

| | | |
|---|---|---|
| 2011/0260899 A1 | 10/2011 | Snedeker |
| 2012/0075128 A1* | 3/2012 | Aruga ................ H03M 1/1019 341/110 |
| 2015/0180498 A1 | 6/2015 | Yang |
| 2019/0372584 A1 | 12/2019 | Emira et al. |

OTHER PUBLICATIONS

Ming Ding et al., "A 46 µW 13 b 6.4 MS/s SAR ADC With Background Mismatch and Offset Calibration", IEEE Journal of Solid-State Circuits, vol. 52, No. 2, Feb. 2017, pp. 423-432.

Xian Gu et al., "A Calibration Technique for SAR ADS Based on Code Density Test", 2015 IEEE 11th International Conference on ASIC (ASICON), IEEE, Nov. 3, 2015, pp. 1-4.

Dusan Vlastimir Stepanovic, "Calibration Techniques for Time-Interleaved SAR A/D Converters", Dec. 4, 2012, XP055245116, ISBN: 978-1-267-97564-5, Retrieved from the Internet: URL: http://digitalassets.lib.berkeley.edu/techreports/ucb/text/EECS-2012-225.pdf [retrieved on Jan. 27, 2016].

\* cited by examiner

| BIT1CAL<3:0> | MSB Cap | NOMINAL CAPACITANCE |
|---|---|---|
| 0000 | 30C | |
| 0001 | 31C | |
| 0011 | 32C | |
| 0111 | 33C | |
| 1111 | 34C | |

| BIT2CAL<3:0> | MSB-1 Cap | NOMINAL CAPACITANCE |
|---|---|---|
| 0000 | 14C | |
| 0001 | 15C | |
| 0011 | 16C | |
| 0111 | 17C | |
| 1111 | 18C | |

GROUPING OF SUB-ADC UNITS INTO SUB-SETS

| Sub-Set Number | Sub-Sets of 4 ||||  | Sub-Sets of 5 |||||
|---|---|---|---|---|---|---|---|---|---|---|
|  | SADC0 | SADC1 | SADC2 | SADC3 |  | SADC0 | SADC1 | SADC2 | SADC3 | SADC4 |
| SS1 | 1 | 2 | 3 | 4 |  | 1 | 2 | 3 | 4 | 5 |
| SS2 | 5 | 6 | 7 | 8 |  | 6 | 7 | 8 | 9 | 10 |
| SS3 | 9 | 10 | 11 | 12 |  | 11 | 12 | 13 | 14 | 15 |
| SS4 | 13 | 14 | 15 | 16 |  | 16 | 17 | 18 | 19 | 20 |
| SS5 | 17 | 18 | 19 | 20 |  | 21 | 22 | 23 | 24 | 25 |
| SS6 | 21 | 22 | 23 | 24 |  | 26 | 27 | 28 | 29 | 30 |
| SS7 | 25 | 26 | 27 | 28 |  | 31 | 32 | 33 | 34 | 35 |
| SS8 | 29 | 30 | 31 | 32 |  | 36 | 37 | 38 | 39 | 40 |
| SS9 | 33 | 34 | 35 | 36 |  | 41 | 42 | 43 | 44 | 45 |
| SS10 | 37 | 38 | 39 | 40 |  | 46 | 47 | 48 | 49 | 50 |
| SS11 | 41 | 42 | 43 | 44 |  | 51 | 52 | 53 | 54 | 55 |
| SS12 | 45 | 46 | 47 | 48 |  | 56 | 57 | 58 | 59 | 60 |
| SS13 | 49 | 50 | 51 | 52 |  | 61 | 62 | 63 | 64 | 65 |
| SS14 | 53 | 54 | 55 | 56 |  | 66 | 67 | 68 | 69 | 70 |
| SS15 | 57 | 58 | 59 | 60 |  | 71 | 72 | 73 | 74 | 75 |
| SS16 | 61 | 62 | 63 | 64 |  | 76 | 77 | 78 | 79 | 80 |
| SS17 | 65 | 66 | 67 | 68 |  |  |  |  |  |  |
| SS18 | 69 | 70 | 71 | 72 |  |  |  |  |  |  |
| SS19 | 73 | 74 | 75 | 76 |  |  |  |  |  |  |
| SS20 | 77 | 78 | 79 | 80 |  |  |  |  |  |  |

FIG. 13

NOMINAL CAPACITANCES PER SUB-SET OF 4

| Test Configuration | SADC0 MSB | SADC1 MSB | SADC2 MSB | SADC3 MSB | Avg MSB | SADC0 MSB-1 | SADC1 MSB-1 | SADC2 MSB-1 | SADC3 MSB-1 | Avg MSB-1 | Test Configuration |
|---|---|---|---|---|---|---|---|---|---|---|---|
| 1 | 30 | 30 | 30 | 30 | 30 | 14 | 14 | 14 | 14 | 14 | 1 |
|   | 30 | 30 | 30 | 31 | 30.25 | 14 | 14 | 14 | 15 | 14.25 | 2 |
| 2 | 30 | 30 | 31 | 31 | 30.5 | 14 | 14 | 15 | 15 | 14.5 | 3 |
|   | 30 | 31 | 31 | 31 | 30.75 | 14 | 15 | 15 | 15 | 14.75 | 4 |
| 3 | 31 | 31 | 31 | 31 | 31 | 15 | 15 | 15 | 15 | 15 | 5 |
|   | 31 | 31 | 31 | 32 | 31.25 | 15 | 15 | 15 | 16 | 15.25 | 6 |
| 4 | 31 | 31 | 32 | 32 | 31.5 | 15 | 15 | 16 | 16 | 15.5 | 7 |
|   | 31 | 32 | 32 | 32 | 31.75 | 15 | 16 | 16 | 16 | 15.75 | 8 |
| 5 | 32 | 32 | 32 | 32 | 32 | 16 | 16 | 16 | 16 | 16 | 9 |
|   | 32 | 32 | 32 | 33 | 32.25 | 16 | 16 | 16 | 17 | 16.25 |   |
| 6 | 32 | 32 | 33 | 33 | 32.5 | 16 | 16 | 17 | 17 | 16.5 |   |
|   | 32 | 33 | 33 | 33 | 32.75 | 16 | 17 | 17 | 17 | 16.75 |   |
| 7 | 33 | 33 | 33 | 33 | 33 | 17 | 17 | 17 | 17 | 17 |   |
|   | 33 | 33 | 33 | 34 | 33.25 | 17 | 17 | 17 | 18 | 17.25 |   |
| 8 | 33 | 33 | 34 | 34 | 33.5 | 17 | 17 | 18 | 18 | 17.5 |   |
|   | 33 | 34 | 34 | 34 | 33.75 | 17 | 18 | 18 | 18 | 17.75 |   |
| 9 | 34 | 34 | 34 | 34 | 34 | 18 | 18 | 18 | 18 | 18 |   |

FIG. 14

NOMINAL CAPACITANCES PER SUB-SET OF 5

| Test Configuration | SADC0 MSB | SADC1 MSB | SADC2 MSB | SADC3 MSB | SADC4 MSB | Avg MSB | SADC0 MSB-1 | SADC1 MSB-1 | SADC2 MSB-1 | SADC3 MSB-1 | SADC4 MSB-1 | Avg MSB-1 | Test Configuration |
|---|---|---|---|---|---|---|---|---|---|---|---|---|---|
| 1 | 30 | 30 | 30 | 30 | 30 | 30 | 14 | 14 | 14 | 14 | 14 | 14 | |
| | 30 | 30 | 30 | 30 | 31 | 30.2 | 14 | 14 | 14 | 14 | 15 | 14.2 | |
| 2 | 30 | 30 | 30 | 31 | 31 | 30.4 | 14 | 14 | 14 | 15 | 15 | 14.4 | |
| | 30 | 30 | 31 | 31 | 31 | 30.6 | 14 | 14 | 15 | 15 | 15 | 14.6 | |
| 3 | 30 | 31 | 31 | 31 | 31 | 30.8 | 14 | 15 | 15 | 15 | 15 | 14.8 | 1 |
| | 31 | 31 | 31 | 31 | 31 | 31 | 15 | 15 | 15 | 15 | 15 | 15 | 2 |
| 4 | 31 | 31 | 31 | 31 | 32 | 31.2 | 15 | 15 | 15 | 15 | 16 | 15.2 | 3 |
| | 31 | 31 | 31 | 32 | 32 | 31.4 | 15 | 15 | 15 | 16 | 16 | 15.4 | 4 |
| 5 | 31 | 31 | 32 | 32 | 32 | 31.6 | 15 | 15 | 16 | 16 | 16 | 15.6 | 5 |
| | 31 | 32 | 32 | 32 | 32 | 31.8 | 15 | 16 | 16 | 16 | 16 | 15.8 | 6 |
| 6 | 32 | 32 | 32 | 32 | 32 | 32 | 16 | 16 | 16 | 16 | 16 | 16 | 7 |
| | 32 | 32 | 32 | 32 | 33 | 32.2 | 16 | 16 | 16 | 16 | 17 | 16.2 | 8 |
| 7 | 32 | 32 | 32 | 33 | 33 | 32.4 | 16 | 16 | 16 | 17 | 17 | 16.4 | 9 |
| | 32 | 32 | 33 | 33 | 33 | 32.6 | 16 | 16 | 17 | 17 | 17 | 16.6 | 10 |
| 8 | 32 | 33 | 33 | 33 | 33 | 32.8 | 16 | 17 | 17 | 17 | 17 | 16.8 | 11 |
| | 33 | 33 | 33 | 33 | 33 | 33 | 17 | 17 | 17 | 17 | 17 | 17 | |
| 9 | 33 | 33 | 33 | 33 | 34 | 33.2 | 17 | 17 | 17 | 17 | 18 | 17.2 | |
| | 33 | 33 | 33 | 34 | 34 | 33.4 | 17 | 17 | 17 | 18 | 18 | 17.4 | |
| 10 | 33 | 33 | 34 | 34 | 34 | 33.6 | 17 | 17 | 18 | 18 | 18 | 17.6 | |
| | 33 | 34 | 34 | 34 | 34 | 33.8 | 17 | 18 | 18 | 18 | 18 | 17.8 | |
| 11 | 34 | 34 | 34 | 34 | 34 | 34 | 18 | 18 | 18 | 18 | 18 | 18 | |

FIG. 15

| Weights → | 8W | 4W | 2W | 1W | |
|---|---|---|---|---|---|
| GAINCAL1< 3:0 > | < 3 > | < 2 > | < 1 > | < 0 > | Total Weight |
| 0 | 0 | 0 | 0 | 0 | 0W |
| 1 | 0 | 0 | 0 | 1 | 1W |
| 2 | 0 | 0 | 1 | 0 | 2W |
| 3 | 0 | 0 | 1 | 1 | 3W |
| 4 | 0 | 1 | 0 | 0 | 4W |
| 5 | 0 | 1 | 0 | 1 | 5W |
| 6 | 0 | 1 | 1 | 0 | 6W |
| 7 | 0 | 1 | 1 | 1 | 7W |
| 8 | 1 | 0 | 0 | 0 | 8W |
| 9 | 1 | 0 | 0 | 1 | 9W |
| A | 1 | 0 | 1 | 0 | 10W |
| B | 1 | 0 | 1 | 1 | 11W |
| C | 1 | 1 | 0 | 0 | 12W |
| D | 1 | 1 | 0 | 1 | 13W |
| E | 1 | 1 | 1 | 0 | 14W |
| F | 1 | 1 | 1 | 1 | 15W |

LINEARITY AND/OR GAIN IN MIXED-SIGNAL CIRCUITRY

CROSS-REFERENCE OF RELATED APPLICATIONS

This application claims the benefit of European Patent Application No. 21188220.4, filed on Jul. 28, 2021, the entire disclosure of which Application is incorporated by reference herein.

The present invention relates to linearity and/or gain in mixed-signal circuitry, and in particular in analogue-to-digital converter (ADC) circuitry and digital-to-analogue converter (DAC) circuitry. Such circuitry may be implemented as integrated circuitry, for example on an IC chip.

In some instances, the present invention relates to ADC circuitry configured to use successive approximation to arrive at a multi-bit digital value representative of an analogue input value. Such circuitry itself comprises DAC circuitry.

A successive approximation register (SAR) ADC typically uses a comparator in each of its successive approximation (sub-conversion) operations. Successive-approximation conversion may be considered as one example of a conversion process which is made up of a sequence of such sub-conversion operations. Such ADC circuitry (mixed-signal circuitry) may have particular use, for example, as the ADC circuitry (sub-ADC units) used at the ends of the paths in the sampling circuitry disclosed in EP-A1-2211468.

As background, therefore, to explore merely one potential application of circuitry of the present invention, aspects of the sampling circuitry disclosed in EP-A1-2211468 will now be considered.

FIG. 1 is a schematic diagram of overall analogue-to-digital circuitry 40, to which the present invention may be applied. Circuitry 40 comprises sampler 42, voltage-controlled oscillator (VCO) 44 as an example clock-signal generator, demultiplexers 46, ADC banks 48, digital unit 50 and calibration unit 52. It will become apparent that actual successive—approximation conversion takes place in the sub-ADC units (or ADC sub-units) of the ADC banks 48, and thus focus will be placed on these banks and their configuration later herein.

The sampler 42 is configured to perform four-way or four-phase time-interleaving so as to split the input current $I_{IN}$ by current steering into four time-interleaved sample streams A to D. For this purpose, VCO 44 is a quadrature VCO operable to output four clock signals 90° out of phase with one another, for example as four raised cosine signals.

VCO 44 may for example be a shared 16 GHz quadrature VCO to enable circuitry 40 to have an overall sample rate of 64 GS/s.

Each of streams A to D comprises a demultiplexer 46 and an ADC bank 48 connected together in series as shown in FIG. 1. The sampler 42 operates in the current mode and, accordingly, streams A to D are effectively four time-interleaved streams of current pulses originating from (and together making up) input current $I_{IN}$, each stream having a sample rate one quarter of the overall sample rate. Continuing the example overall sample rate of 64 GS/s, each of the streams A to D may have a 16 GS/s sample rate.

Focusing on stream A by way of example, the stream of current pulses is first demultiplexed by an n-way demultiplexer 46. Demultiplexer 46 is a current-steering demultiplexer and this performs a similar function to sampler 42, splitting stream A into n time-interleaved streams.

The n streams output from demultiplexer 46 pass into ADC bank 48, which contains n ADC sub-units each operable to convert its incoming pulse stream into digital signals, for example into 8-bit digital values. Accordingly, n digital streams pass from ADC bank 48 to digital unit 50.

Streams B, C, and D operate analogously to stream A, and accordingly duplicate description is omitted. If n=80, circuitry 40 may be considered to comprise 320 ADC sub-units split between the four ADC banks 48.

Calibration unit 52 is connected to receive a signal or signals from the digital unit 50 and, based on that signal, to determine control signals to be applied to one or more of the sampler 42, VCO 44, demultiplexers 46 and ADC banks 48.

FIG. 2 is a schematic diagram useful for understanding the principle of operation of ADC banks 48. For simplicity, only one output 60 of the demultiplexers 46 is shown, and consequently the ADC circuitry 48 shown represents only the ADC circuitry (sub-ADC unit) required for that particular output. Similar ADC circuitry 48 (sub-ADC units) may be provided for all the outputs of the demultiplexers 46.

ADC circuitry 48 generally takes the form of a capacitance 150. As shown in FIG. 2, capacitance 150 may be variable in value. Generally speaking, capacitance 150 is employed to convert the current pulses from output 60 into voltage values $V_{OUT}$. That is, each pulse charges up capacitance 150 to a voltage proportional to the area of the pulse concerned. This is because the amount of charge in each current pulse is defined by its area (Q=∫I dt), and because the voltage across the capacitance 150 is defined by that amount of charge Q and the capacitance value C (V=Q/C).

The voltage $V_{OUT}$ for a particular pulse is held across capacitance 150 until the circuitry 48 is reset by reset switch 152. Whilst the voltage $V_{OUT}$ for a particular pulse is held, this analog output value can be converted into a digital output value, for example using an ADC circuit employing a successive-approximation register (SAR). In the case of differential circuitry, as may be the case for the FIG. 1 circuitry although not explicitly shown, each $V_{OUT}$ will have its complementary $V_{OUT}$, and the pair may be applied together to a differential comparator so that a single digital output for that pair is output.

An advantage of this mode of operation is that even if delays are experienced within the demultiplexers 46, the charge in each pulse will still make it to the relevant outputs, albeit over a slightly longer period. In that case, the voltage $V_{OUT}$ produced from the pulse remains unaffected. To illustrate this point, two examples 154 and 156 of the same current pulse are shown in FIG. 2. The first pulse 154 represents a case in which minimal delay is experienced. The second pulse 156 represents a case in which some delay/spreading is experienced, for example due to track capacitance in the circuitry. Consequently, pulse 156 is stretched in time as compared to pulse 154. Importantly, the area of the two pulses 154 and 156 is substantially the same, and thus the output voltage $V_{OUT}$ would be the same for both.

FIG. 3 is a schematic diagram useful for understanding a possible application of SAR-ADC (Successive Approximation Register—Analogue-to-Digital Conversion) circuitry within each sub-ADC unit of the circuitry 48 in FIG. 1. Such circuitry could have a cycle of sub-conversion operations (phases/steps) of the form: Reset (R); Sample (S); 1; 2; 3; 4; 5; 6; 7 and 8, as shown in FIG. 3. In each Sample sub-conversion operation, a current pulse concerned may be converted into an output voltage $V_{OUT}$, and subsequently that voltage $V_{OUT}$ may be turned into an 8-bit digital value over the following 8 SAR sub-conversion operations. The next Reset sub-conversion operation then prepares the circuitry for the next current pulse. With reference to FIG. 1, the sub-ADC units of the circuitry 48 may carry out their sub-conversion operations in a time-interleaved manner so that their digital values are output in a sequence corresponding to the sequence of analogue samples (current pulses) provided to those sub-ADC unis.

FIG. 4 presents example SAR ADC circuitry which may be employed with the circuitry of FIGS. 1 and 2, i.e. as part of the sub-ADC units of the ADC banks 48, merely by way of further introduction to the general concept or SAR conversion. The main elements are a S/H (Sample/Hold—or sampler) circuit 170 to acquire $V_{OUT}$ from FIG. 2, a voltage comparator 180, an internal DAC 190 and an SAR 200. It will be appreciated that the arrangement of elements in FIG. 2 is a simple example to aid in an overview understanding of the functionality of SAR ADC circuitry. However, in other arrangements (where e.g. charge-redistribution techniques are used, with the DAC 190 being a capacitive DAC or CDAC), some of the functionality of the elements (e.g. the S/H 170) may be provided as part of the functionality of another element (e.g. the DAC 190).

Continuing with FIG. 4, the comparator 180 compares the held $V_{OUT}$ with the output of the internal DAC 190 and outputs the result of the comparison to the SAR 200. The SAR 200 is designed to supply a digital code approximating to the internal DAC 190. The DAC 190 supplies the comparator with an analogue voltage based upon the digital code input from the SAR 200.

The SAR 200 is initialised so that its MSB is equal to digital 1 (the other bits being digital 0). This code is then input to DAC 190, whose output analogue voltage is supplied to comparator 180. If this analogue voltage is greater than $V_{OUT}$ the comparator 180 causes SAR 200 to reset this bit; otherwise, the bit is kept as a 1. Then, the next bit is set to 1 and the same procedure (sub-conversion operation) is followed, continuing this binary search until every bit in the SAR 200 has been tested (these "tests" corresponding respectively to sub-conversion operations 1 to 8 in FIG. 3). The resulting digital code output from the SAR 200 is the digital approximation of the sample voltage $V_{OUT}$ and is finally output when the conversion is complete.

It will be apparent that each such "test" involves a comparison operation performed by the comparator. Typically, such sub-conversion operations are carried out synchronously, i.e. with each sub-conversion operation taking the same amount of time as regulated by a clock signal. This may mean that each sub-conversion has a "compare" period during which the necessary comparison is carried out, and at the end of which the result of the comparison is delivered to the surrounding circuitry. This "compare" period may then be followed by a "reset" period in which the comparator is readied for the next comparison, i.e. the next sub-conversion operation.

It has been found that such SAR ADC circuitry, where the DAC 190 is a CDAC, suffers from performance issues related to linearity and gain mismatch, in particular where provided as part of each sub-ADC unit of overall ADC circuitry corresponding to FIG. 1.

It is desirable to solve some or all of the above problems.

According to an embodiment of a first aspect of the present invention there is provided analogue-to-digital converter, ADC, circuitry for converting a series of analogue samples into a corresponding series of digital output values, the ADC circuitry comprising: a set of sub-ADC units for carrying out analogue-to-digital conversion operations to convert respective said analogue samples into their corresponding digital output values; and control circuitry, wherein: each sub-ADC unit is configured for successive-approximation analogue-to-digital conversion and comprises an array of capacitors at least some of which are configured to be individually-switched in a series of successive approximation operations per conversion of an analogue sample into its digital output value, the capacitors configured to have nominal capacitances; a given capacitor of the array of capacitors in each of the sub-ADC units is a target capacitor; the set of sub-ADC units comprises a plurality of sub-sets of sub-ADC units; at least one of the target capacitors per sub-set of sub-ADC units is a variable capacitor, controllable by the control circuitry to have any one of a plurality of nominal capacitances defined by the configuration of that capacitor; and the control circuitry is configured to: in a test mode, control the variable capacitors so that the set of sub-ADC units is configured into each of a plurality of different test configurations in turn, and measure the performance of the ADC circuitry based on the series of digital output values in each of the test configurations, each test configuration configuring the variable capacitors so that, per sub-set of sub-ADC units, an average (e.g. mean, or a total or other mathematical combination) nominal capacitance of the target capacitors has a given value defined by that test configuration; and in an operational mode following the test mode, configure the set of sub-ADC units into one of the set of test configurations based on the measured performances.

In this way it is possible to efficiently find a test configuration which leads to improved linearity of the overall ADC circuitry.

According to an embodiment of a second aspect of the present invention there is provided mixed-signal circuitry comprising: a set of capacitive digital-to-analogue converter, CDAC, units for carrying out digital-to-analogue conversion operations to convert respective digital values into corresponding analogue values; and control circuitry, wherein: each CDAC unit comprises an array of capacitors at least some of which are configured to be individually-switched dependent on the digital values, the capacitors configured to have nominal capacitances; a given capacitor of the array of capacitors in each of the CDAC units is a target capacitor; the set of CDAC units comprises a plurality of sub-sets of CDAC units; at least one of the target capacitors per sub-set of CDAC units is a variable capacitor, controllable by the control circuitry to have any one of a plurality of nominal capacitances defined by the configuration of that capacitor; and the control circuitry is configured to: in a test mode, control the variable capacitors so that the set of CDAC units is configured into each of a plurality of different test configurations in turn, and measure the performance of the mixed-signal circuitry based on the analogue values in each of the test configurations, each test configuration configuring the variable capacitors so that, per sub-set of CDAC units, an average (or total) nominal capacitance of the target capacitors has a given value defined by that test configuration; and in an operational mode following the test mode, configure the set of CDAC units into one of the set of test configurations based on the measured performances.

In this way it is possible to efficiently find a test configuration which leads to improved linearity of the overall mixed-signal circuitry.

According to an embodiment of a third aspect of the present invention there is provided analogue-to-digital converter, ADC, circuitry for converting a series of analogue samples into a corresponding series of digital output values, the ADC circuitry comprising: a set of sub-ADC units for carrying out analogue-to-digital conversion operations to convert respective said analogue samples into their corresponding digital output values; and control circuitry, wherein: each sub-ADC unit is configured for successive-approximation analogue-to-digital conversion and comprises an array of capacitors at least some of which are configured to be individually-switched in a series of successive approximation operations per conversion of an analogue sample into its digital output value; and the control circuitry is configured to: in a test mode, control the set of sub-ADC units to configure them into each of a plurality of different test configurations in turn, and measure the performance of the ADC circuitry based on the series of digital output values in each of the test configurations; and in an operational mode following the test mode, configure the set of sub-ADC units into one of the set of test configurations based on the measured performances, wherein: for at least one of the sub-ADC units, a given capacitor of the array of capacitors is configured to be unswitched in the series of successive approximation operations and is a variable capacitor, and the control circuitry is configured to control the capacitance of the at least one variable capacitor to configure the set of sub-ADC units into each of the plurality of different test configurations in turn; and/or for at least one of the sub-ADC units, the capacitors of the array which are configured to be individually-switched are configured so that, when switched, a voltage level at one of the terminals of the capacitor concerned changes by an amount defined by a voltage level of a reference voltage signal, and the control circuitry is configured to control the voltage level of the reference voltage signal for the at least one of the sub-ADC units to configure the set of sub-ADC units into each of the plurality of different test configurations in turn.

In this way it is possible to efficiently find a test configuration which leads to improved performance (in terms of the effect of gain mismatch) of the overall ADC circuitry.

According to an embodiment of a fourth aspect of the present invention there is provided mixed-signal circuitry comprising: a set of capacitive digital-to-analogue converter, CDAC, units for carrying out digital-to-analogue conversion operations to convert respective digital values into corresponding analogue values; and control circuitry, wherein: each CDAC unit comprises an array of capacitors at least some of which are configured to be individually-switched dependent on the digital values; and the control circuitry is configured to: in a test mode, control the set of CDAC units to configure them into each of a plurality of different test configurations in turn, and measure the performance of the mixed-signal circuitry based on the analogue values in each of the test configurations; and in an operational mode following the test mode, configure the set of CDAC units into one of the set of test configurations based on the measured performances, wherein: for at least one of the CDAC units, a given capacitor of the array of capacitors is configured to be unswitched dependent on the digital values and is a variable capacitor, and the control circuitry is configured to control the capacitance of the at least one variable capacitor to configure the set of CDAC units into each of the plurality of different test configurations in turn; and/or for at least one of the CDAC units, the capacitors of the array which are configured to be individually-switched are configured so that, when switched, a voltage level at one of the terminals of the capacitor concerned changes by an amount defined by a voltage level of a reference voltage signal, and the control circuitry is configured to control the voltage level of the reference voltage signal for the at least one of the CDAC units to configure the set of CDAC units into each of the plurality of different test configurations in turn.

In this way it is possible to efficiently find a test configuration which leads to improved performance (in terms of the effect of gain mismatch) of the overall mixed-signal circuitry.

According to an embodiment of a fifth aspect of the present invention there is provided Analogue-to-digital converter, ADC, circuitry comprising: an ADC unit for carrying out analogue-to-digital conversion operations to convert respective analogue samples into corresponding digital output values; and control circuitry, wherein: the ADC unit is configured for successive-approximation analogue-to-digital conversion and comprises an array of capacitors at least some of which are configured to be individually-switched in a series of successive approximation operations per conversion of an analogue sample into its digital output value; and the control circuitry is configured to carry out a calibration operation comprising: determining the gain of the ADC unit based on the analogue samples and the corresponding digital output values it generates; and whilst determining the gain of the ADC unit, adjusting the determined gain towards or to a target value, wherein: a given capacitor of the array of capacitors is configured to be unswitched in the series of successive approximation operations and is a variable capacitor, and the control circuitry is configured to adjust the determined gain by adjusting the capacitance of the variable capacitor; and/or the capacitors of the array which are configured to be individually-switched are configured so that, when switched, a voltage level at one of the terminals of the capacitor concerned changes by an amount defined by a voltage level of a reference voltage signal, and the control circuitry is configured to adjust the determined gain by adjusting the voltage level of the reference voltage signal.

In this way it is possible to calibrate the gain of the ADC unit, and potentially a plurality of such ADC units to reduce gain mismatch.

According to an embodiment of a sixth aspect of the present invention there is provided mixed-signal circuitry comprising: a capacitive digital-to-analogue converter, CDAC, unit for carrying out digital-to-analogue conversion operations to convert respective digital values into corresponding analogue values; and control circuitry, wherein: the CDAC unit comprises an array of capacitors at least some of which are configured to be individually-switched dependent on the digital values; and the control circuitry is configured to carry out a calibration operation comprising: determining the gain of the CDAC unit based on the digital values and the corresponding analogue values it generates; and whilst determining the gain of the ADC unit, adjusting the determined gain towards or to a target value, wherein: a given capacitor of the array of capacitors is configured to be unswitched dependent on the digital values, and the control circuitry is configured to adjust the determined gain by adjusting the capacitance of the variable capacitor; and/or the capacitors of the array which are configured to be individually-switched are configured so that, when switched, a voltage level at one of the terminals of the capacitor concerned changes by an amount defined by a voltage level of a reference voltage signal, and the control circuitry is configured to adjust the determined gain by adjusting the voltage level of the reference voltage signal.

In this way it is possible to calibrate the gain of the CDAC unit, and potentially a plurality of such CDAC units to reduce gain mismatch.

Also envisaged are ADC circuitry aspects, comprising mixed-signal circuitry according to any of the mixed-signal circuitry aspects.

Also envisaged are integrated circuitry aspects, such as an IC chip aspects, comprising mixed-signal circuitry according to any of the mixed-signal circuitry aspects or ADC circuitry according to any of the ADC circuitry aspects.

Also envisaged are method aspects corresponding to the mixed-signal circuitry aspects and the ADC circuitry aspects.

Reference will now be made, by way of example, to the accompanying drawings, of which:

FIG. 1, as mentioned above, is a schematic diagram of overall analogue-to-digital circuitry;

FIG. 2, as mentioned above, is a schematic diagram useful for understanding the principle of operation of the ADC banks of FIG. 1;

FIG. 3, as mentioned above, is a schematic diagram useful for understanding a possible application of SAR-ADC circuitry within each sub-ADC unit of the FIG. 1 circuitry;

FIG. 4, as mentioned above, presents example SAR ADC circuitry which may be employed with the circuitry of FIGS. 1 and 2;

FIG. 13 is a table useful for understanding a grouping of the set of sub-ADC units of the FIG. 11 circuitry into sub-sets;

FIGS. 14 and 15 are tables useful for understanding nominal capacitances to which the MSB and MSB-1 capacitors may be set, per sub-set, for example different test configurations;

Embodiments of the present invention seek to address the above problems.

Figure 5:
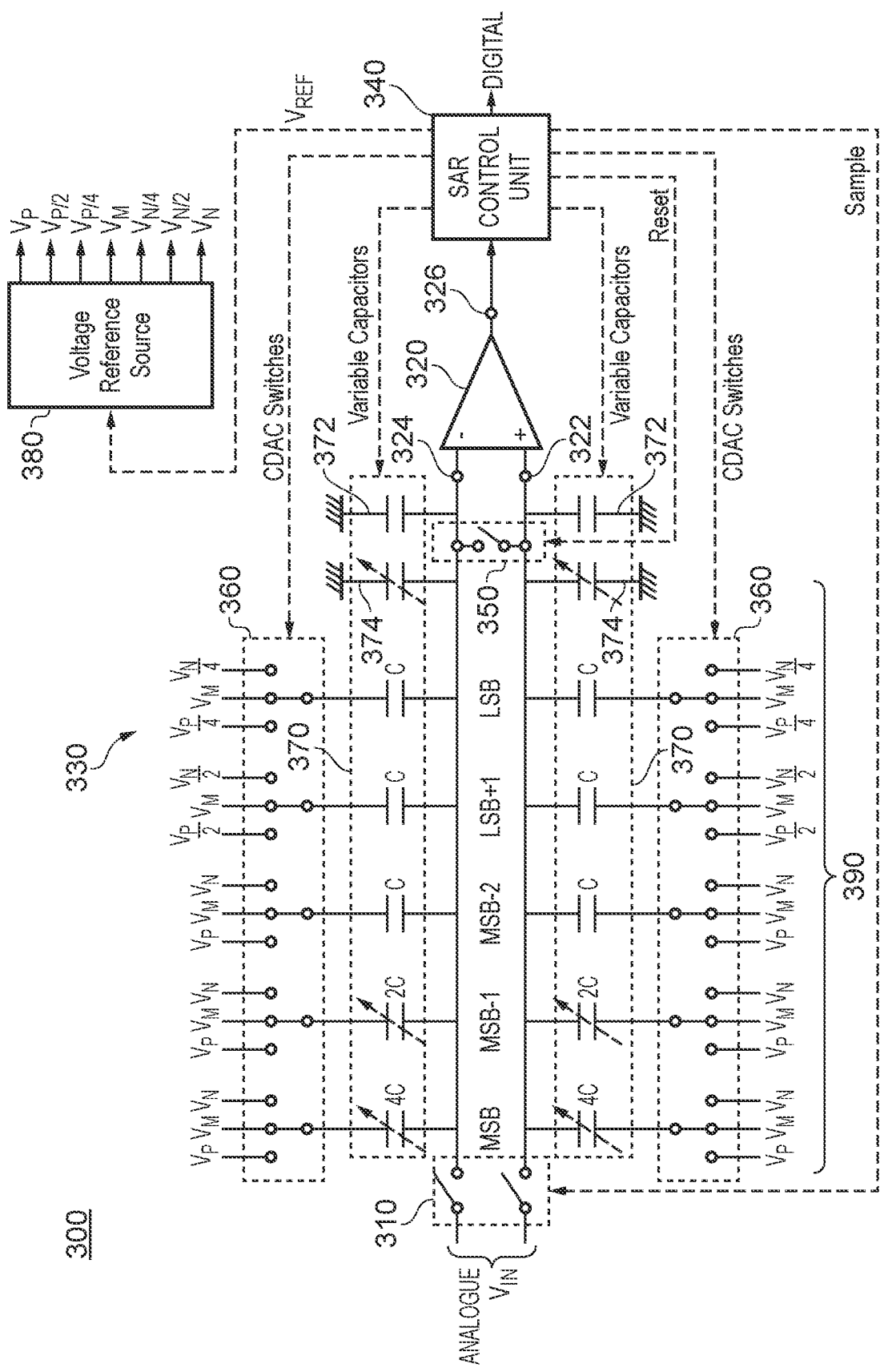
FIG. 5 is a schematic diagram of SAR ADC circuitry embodying the present invention.

In order to provide context for embodiments of the present invention, FIG. 5 is a schematic diagram of SAR ADC circuitry 300. The SAR ADC circuitry 300 is implemented as differential circuitry and can be considered to be an example implementation of a sub-ADC unit of FIG. 1.

The ADC circuitry 300 comprises a differential analogue input terminal 310 (shown with a pair of sampling switches), a comparator 320 and successive-approximation control circuitry 330 (which may be referred to simply as successive-approximation circuitry). Also shown is a voltage reference source 380 which may be considered part of the successive-approximation control circuitry 330 or generally part of the SAR ADC circuitry 300.

Figure 1:
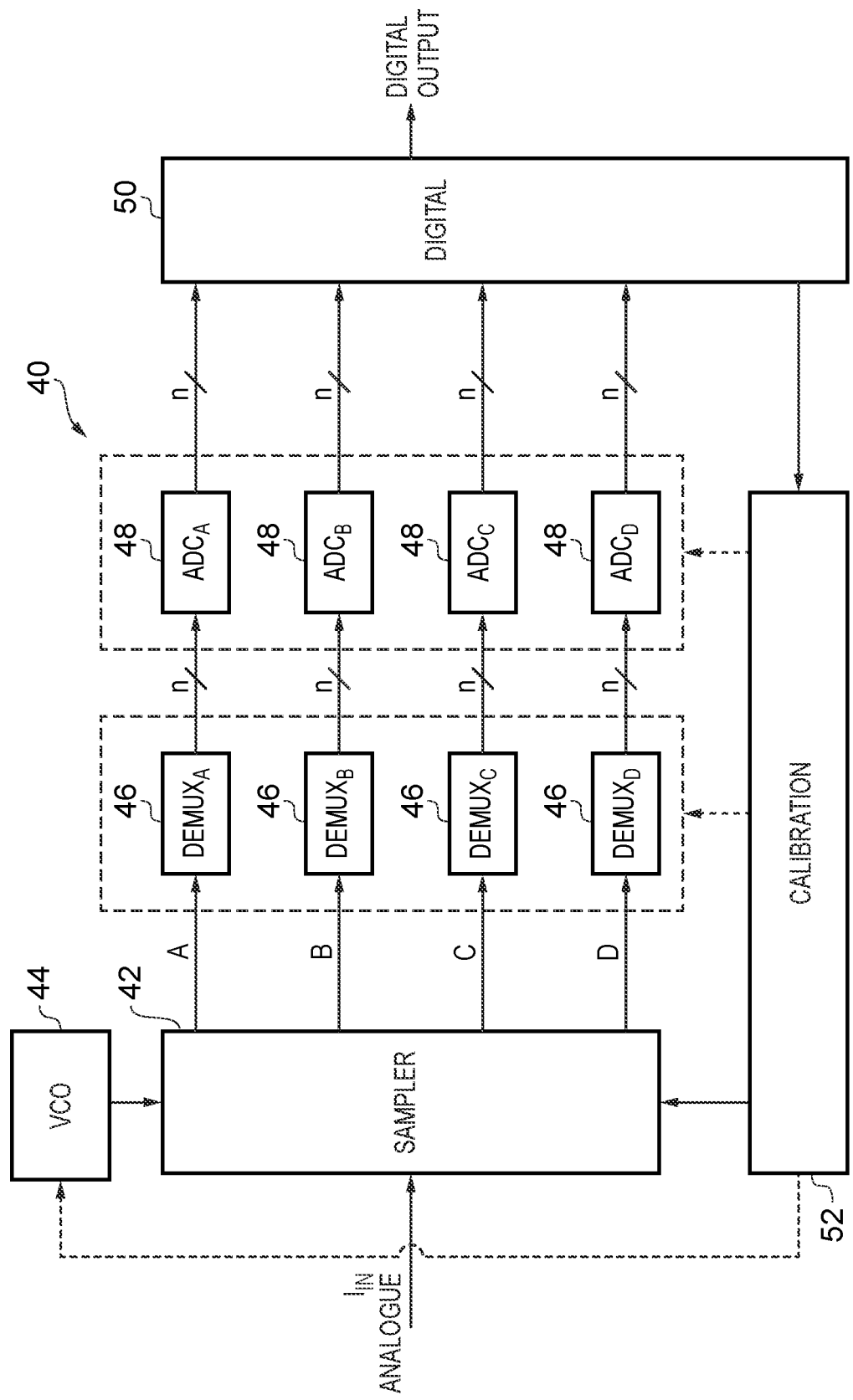
Figure 2:
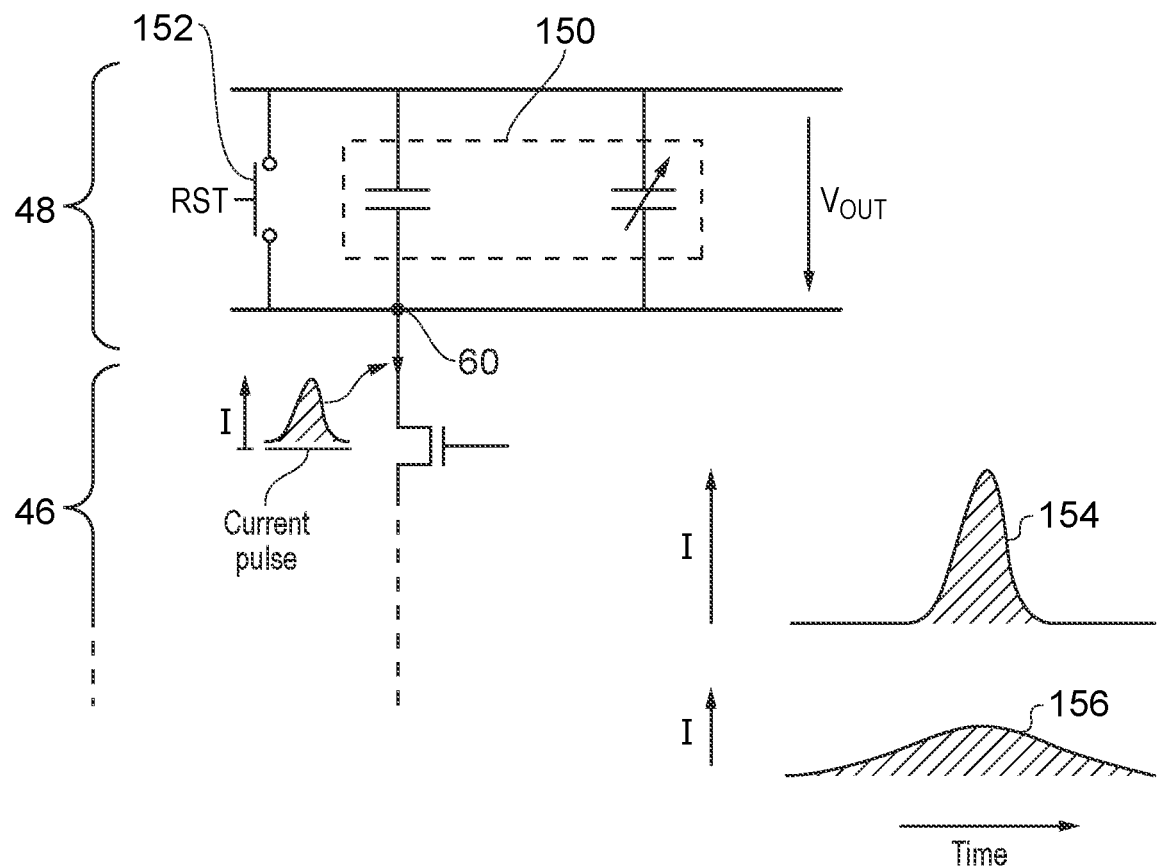
Figure 3:
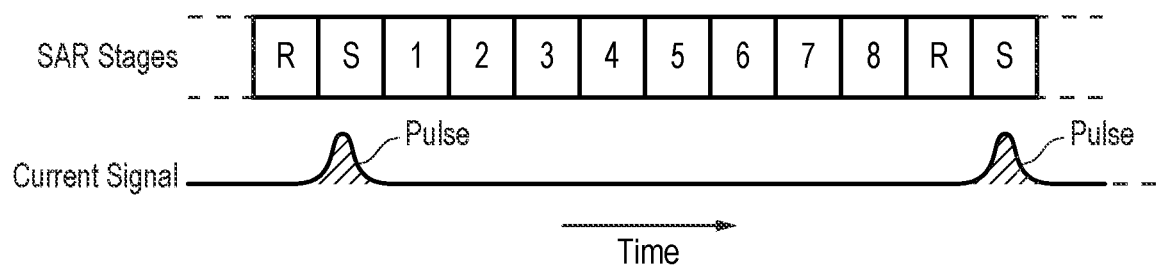

The analogue input terminal 310 is connected to receive an analogue input voltage signal $V_{IN}$ (which may correspond to a differential pair of charge pulses in line with FIGS. 1 and 2). Thus, $V_{IN}$ in FIG. 5 may correspond to a differential pair of $V_{OUT}$ signals in FIGS. 2 and 4.

The comparator 320 has first and second comparator-input terminals 322 and 324 and a comparator-output terminal 326, and is operable to generate a comparison result (e.g. a logic 1 or 0) at its comparator-output terminal 326 based on a potential difference applied across the comparator-input terminals 322 and 324. The successive-approximation control circuitry 330 is configured to apply a potential difference across the first and second input terminals 322 and 324 based upon the input voltage signal $V_{IN}$ during the sample phase, and configured to control the potential difference for each of a series of successive-approximation operations through charge redistribution as will become apparent, the control applied in each successive-approximation operation being dependent on a comparison result generated by the comparator 320 in the preceding approximation operation.

As shown in FIG. 5, the successive-approximation control circuitry 330 comprises a SAR control unit 340, a charge reset switch 350, a plurality of capacitor switches 360 and a corresponding plurality of capacitors 370. Being differential circuitry, differential sets of capacitor switches 360 and capacitors 370 are shown, and may be referred to as "positive" capacitor switches 360 and capacitors 370 (lower half) and "negative" capacitor switches 360 and capacitors 370 (upper half). All of the capacitors 370 (except for capacitors 372 as discussed later) are discrete capacitors configured to have nominal capacitances (i.e. whose actual capacitances may be subject to process-related inaccuracies).

As indicated, the capacitors 370 which are connected to capacitor switches 360 are weighted (to provide a binary weighting successive-approximation search) to correspond to 5 bits, configuring the ADC circuitry 300 as a 5-bit ADC. These 5 bits will be referred to, from MSB (most significant bit) to LSB (least significant bit), as MSB, MSB-1, MSB-2, LSB+1, and LSB, respectively. Thus, the upper 3 bits (in terms of digital significance) may be considered in an MSB grouping of bits and the lower 2 bits may be considered in an LSB grouping of bits.

The capacitors 370 which are connected to capacitor switches 360 have first and second capacitor terminals, their first terminals being connected to one of the comparator-input terminals 322 and 324, and their second terminals being connected via respective capacitor switches 360 to the voltage reference source 380, as indicated. Although not shown in detail to avoid over-complication, it will be understood that each capacitor switch 360 related to the MSB grouping (upper 3 bits) is operable to connect the second terminal of its capacitor 370 to either a $V_P$ voltage supply, a $V_N$ voltage supply or a $V_M$ (or $V_{MD}$) voltage supply being halfway in voltage level between the $V_P$ and $V_N$ voltage levels. Each LSB+1 capacitor switch 360 is operable to connect the second terminal of its capacitor 370 to either a $V_{P/2}$ voltage supply, a $V_{N/2}$ voltage supply or the $V_M$ (or $V_{MD}$) voltage supply. Each LSB capacitor switch 360 is operable to connect the second terminal of its capacitor 370 to either a $V_{P/4}$ voltage supply, a $V_{N/4}$ voltage supply or the $V_M$ (or $V_{MD}$) voltage supply.

Figure 6:
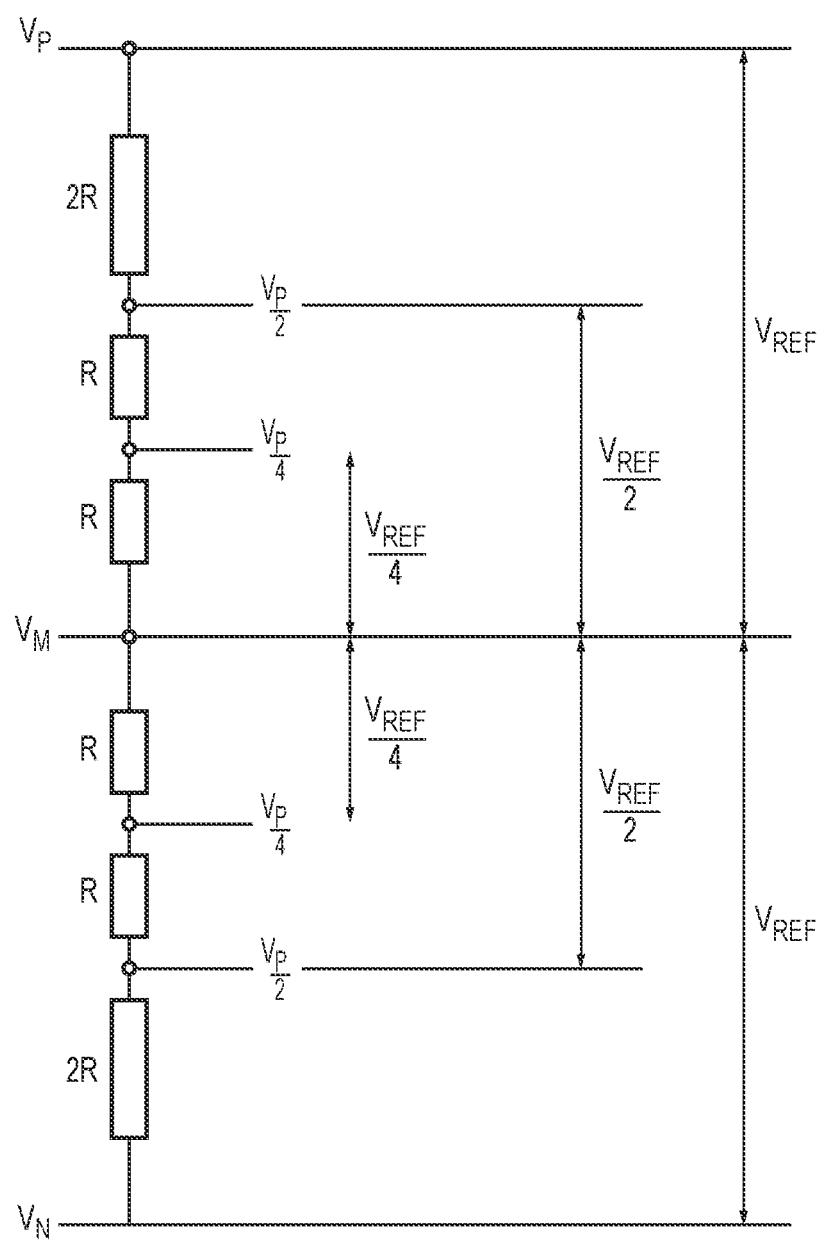
FIG. 6 is a schematic diagram representing the voltage reference source of FIG. 5.

FIG. 6 is a schematic diagram representing the voltage reference source 380 as a resistor ladder (potential divider) configured to provide the requisite voltage levels at tapping points therealong based on the $V_P$ and $V_N$ signals provided at its upper and lower ends respectively, and the switching to those tapping points provided by the switches 360 (effectively implementing an RDAC or resistive DAC). For convenience, it will be understood that the difference $\Delta V$ between the $V_P$ and $V_M$ voltage levels (and the $V_N$ and $V_M$ voltage levels) is reference voltage $V_{REF}$, which can be controlled for example by controlling the $V_P$ and $V_N$ voltage levels. Thus, the difference $\Delta V$ between the $V_{P/2}$ and $V_M$ voltage levels (and $V_{N/2}$ and $V_M$ voltage levels) corresponds to $V_{REF}/2$, and the difference between the $V_{P/4}$ and $V_M$ voltage levels (and $V_{N/4}$ and $V_M$ voltage levels) corresponds to $V_{REF}/4$, as indicated. As such, the arrangement of tapping points in terms of voltage level is symmetrical about $V_M$.

Also shown are capacitors 370 which are not connected to capacitor switches 360. In particular, a differential pair of parasitic capacitors 372 and an optional differential pair of gain-trim capacitors 374 are shown. The differential pair of parasitic capacitors 372 in this case represent a combination of parasitic capacitances and input capacitances at the comparator input terminals (and are thus not discrete capacitances provided e.g. in addition to the comparator but merely representative of capacitances present at the comparator input terminals and shown for completeness). The differential pair of gain-trim capacitors 374 may be provided in some arrangements as will be described later. These capacitors have first and second capacitor terminals, their first terminals being connected to (or at) one of the comparator-input terminals 322 and 324, and their second terminals being connected to ground (or another reference voltage).

The charge reset switch 350 is connected between the comparator input terminals 322, 324 effectively to zero a potential difference between the comparator input terminals 322, 324.

As also shown in FIG. 5, the SAR control unit 340 is connected to be controlled by the comparison result output from the comparator-output terminal 326 and is configured to control the charge reset switch 350 by way of a control signal marked "Reset" and the capacitor switches 360 by way of a control signal marked "CDAC switches" (shown as a pair of control signals). The SAR control unit 340 also controls the sampling switches at the input terminals 310 by way of a control signal marked "Sample".

In some arrangements, one or more of the capacitors 370 (other than capacitors 372) may be a variable capacitor and this is indicated in FIG. 5 for a few of the capacitors 370 convenience, and a control signal marked "Variable Capacitors" is shown (as a pair of control signals) provided by the SAR control unit 340 in order to control the nominal capacitances of those variable capacitors. In some arrangements, however, the control signal marked "Variable Capacitors" may be provided by separate control circuitry (not shown) for example which controls several instances of the ADC circuitry 300. In some arrangements, the reference voltage $V_{REF}$ may be controllable thus controlling the voltage levels output by the voltage reference source 380, and a control signal marked "$V_{REF}$" is shown provided by the SAR control unit 340 in order to provide such control. Again, in some arrangements, the control signal marked "$V_{REF}$" may be provided by separate control circuitry (not shown) for example which controls several instances of the ADC circuitry 300.

As also shown in FIG. 5, the SAR control unit 340 outputs the eventual digital output value representative of a given $V_{IN}$ sample.

It will be appreciated that the capacitors 370 which are connected to capacitor switches 360 in FIG. 5 are given example relative capacitance values 4C, 2C, C, C, C from MSB to LSB, so that their contribution to storing charge (absent any differences between the voltage differences across them) is weighted. The MSB values 4C, 2C, C are binary weighted (with their associated voltages $V_P$, $V_N$ not being weighted from bit to bit) to allow a binary search. The LSB values C, C are the same as one another, but their associated voltages $V_{P/2}$, $V_{N/2}$, and $V_{P/4}$, $V_{N/4}$ are weighted (see FIG. 6) to enable a continued binary search. Incidentally, a binary search is adopted here for simplicity, however it will be appreciated that non-binary searching may also be applied and the present disclosure will be understood accordingly.

The operation of the ADC circuitry 300 may first be understood ignoring the control signals marked "Variable Capacitors" and "$V_{REF}$".

To convert a given analogue input voltage signal $V_{IN}$ sample into a representative digital output value, first all of the capacitors 370 which are connected to capacitor switches 360 are connected at their second capacitor terminals to $V_M$ by virtue of the control signal "CDAC switches" and the charge reset switch 350 is closed. Then the charge reset switch 350 is opened and the input voltage signal $V_{IN}$ is sampled at the input terminal 310 via the sampling switches to the first capacitor terminals to the comparator-input terminal 322 as shown. In this state, the capacitors 370 (connected to a given comparator-input terminal) all have the same potential difference across them, and thus the charge stored on them is weighted by their relative capacitance values. The sampling switches are then opened (with the capacitor switches 360 left in their existing state) and the amount of charge on the capacitors 370 is then effectively held with the potential difference between the capacitor-input terminals 322 and 324 dependent on $V_{IN}$. This is the "start" state.

The successive-approximation operations then proceed one-by-one, each operation controlling a successive one of the differential pairs of capacitors 370 from the MSB pair to the LSB pair in FIG. 5.

In the subsequent operations, referred to as MSB to LSB to correspond to the evaluated bits, the switching applied in the negative side is applied inversely (effectively in the opposite direction) in the positive side. For example, if in one of the MSB group (upper 3 bits) operations a negative capacitor switch 360 switches from $V_M$ to $V_P$ (i.e. $\Delta V$ for the capacitor concerned is +$V_{REF}$) the corresponding positive capacitor switch 360 switches from $V_M$ to $V_N$ (i.e $\Delta V$ for the capacitor concerned is −$V_{REF}$). Similarly, if in the LSB+1 operation the negative capacitor switch 360 switches from $V_M$ to $V_{P/2}$ (i.e. $\Delta V$ for the capacitor concerned is +$V_{REF}/2$) the corresponding positive capacitor switch 360 switches from $V_M$ to $V_{N/2}$ (i.e $\Delta V$ for the capacitor concerned is −$V_{REF}/2$). Similarly, if in the LSB operation the negative capacitor switch 360 switches from $V_M$ to $V_{P/4}$ (i.e. $\Delta V$ for the capacitor concerned is +$V_{REF}/4$) the corresponding positive capacitor switch 360 switches from $V_M$ to $V_{N/4}$ (i.e $\Delta V$ for the capacitor concerned is −$V_{REF}/4$).

Thus, firstly in the MSB operation, the comparator 320 outputs a comparison result in the start state. If the result is negative (logic 0), the negative capacitor switch concerned 360 is switched to $V_N$ and the corresponding positive capacitor switch 360 switches to $V_P$ and the MSB bit of the raw digital output value is assigned value 0. If, however, the result is positive (logic 1), the negative capacitor switch concerned 360 is switched to $V_P$ and the corresponding positive capacitor switch 360 switches to $V_N$ and the MSB bit of the raw digital output value is assigned value 1. Either way, the switching of the MSB capacitor switches 360 causes the (fixed) total amount of charge stored on the capacitors 370 to be redistributed and the potential difference between the comparator-input terminals 322 and 324 to change accordingly. For the avoidance of doubt, the MSB-1, MSB-2, LSB+1 and LSB capacitor switches 360 are not switched in this operation, and this general idea applies mutatis mutandis to the further operations. The next operation can then begin.

In the MSB-1 operation, the comparator outputs a comparison result in the existing state. If the result is negative (logic 0), the negative capacitor switch concerned 360 is switched to $V_N$ and the corresponding positive capacitor switch 360 switches to $V_P$ and the MSB-1 bit of the raw digital output value is assigned value 0. If, however, the result is positive (logic 1), the negative capacitor switch concerned 360 is switched to $V_P$ and the corresponding positive capacitor switch 360 switches to $V_N$ and the MSB-1 bit of the raw digital output value is assigned value 1. Again, the switching of the MSB-1 capacitor switches 360 causes the charge stored on the capacitors 370 to be redistributed.

The MSB-2, LSB+1 and LSB operations proceed in a similar fashion (based on the voltage levels available to their switches 360) and duplicate description will be omitted. At the end of the operations, a final comparison can be carried out which may give a further bit (i.e. a bit 6) and thus the raw digital output value, e.g. 111000, is produced. This value is referred to as a "raw" value since there may be some subsequent "correction" of this result in the SAR control unit 340 (or in other circuitry such as a processor connected thereto and not shown in FIG. 5).

It will be appreciated that the arrangement of 5 bits in FIG. 5, i.e. comprising the MSB group of bits MSB, MSB-1, MSB-2 and the LSB group of bits LSB+1 and LSB, is just an example and the ADC circuitry 300 may be configured to have any number of bits and division between MSB bits and LSB bits. For example, in an example considered later the MSB grouping of bits may extend up by further bits so that the MSB, MSB-1 bits of that arrangement have 32C and 16C capacitors, respectively. Also, it is not essential that the LSB bits use scaled voltage levels (e.g. $V_{P/2}$, $V_{P/4}$), these being useful simply to avoid needing to provide capacitors with values smaller than C. A segmented topology may also be provided, for example with segmentation capacitors separating the first capacitor terminals of the MSB-2 and LSB+1 capacitors on both the positive and negative sides (in which case the comparator input terminals would need to be connected on the left-hand side of the segmentation capacitors, rather than on the right-hand side).

Figure 4:
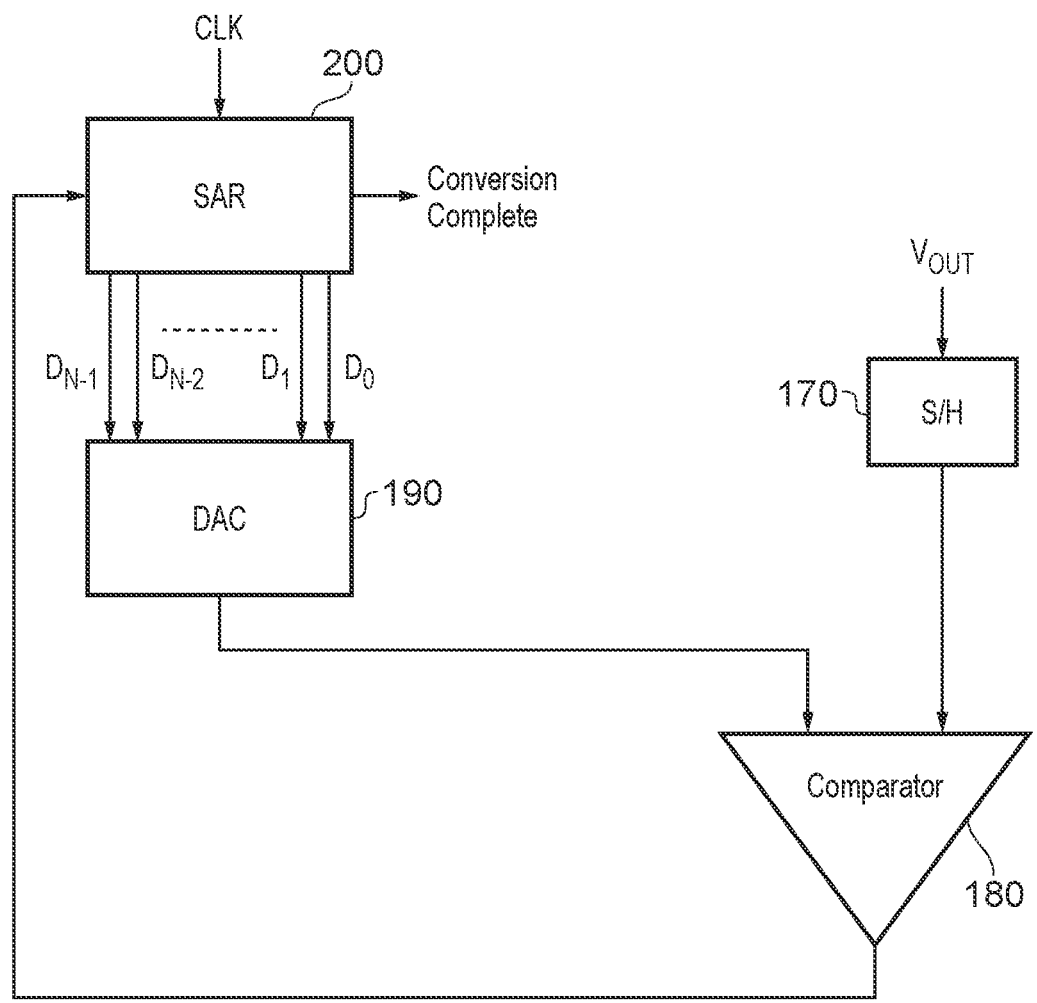

It will also be appreciated, with reference to FIG. 4, that the arrangement of the capacitors 370 and capacitor switches 360 may be referred to as a CDAC 390 as indicated, corresponding to the DAC 190, with the control signal "CDAC switches" corresponding to its digital input, and the potential difference across the capacitor-input terminals corresponding to its analogue output.

Figure 7:
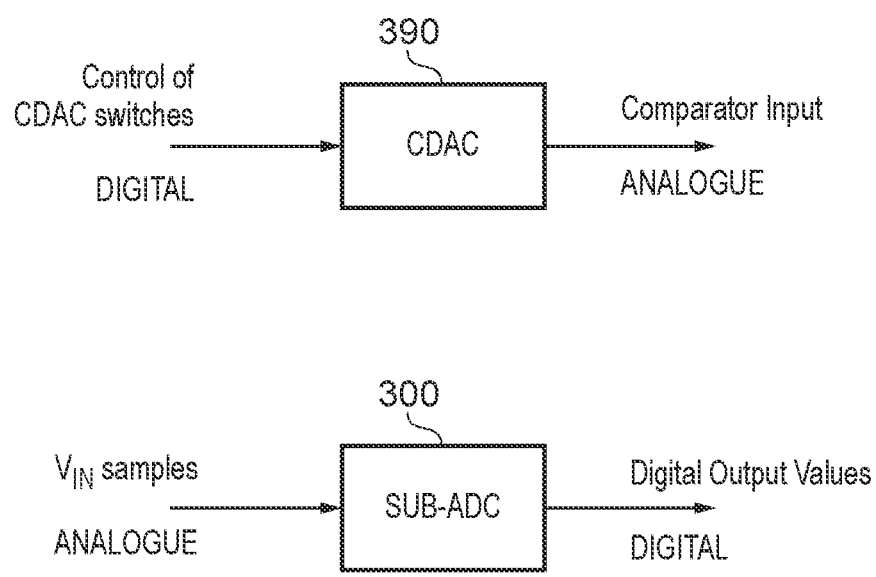
FIG. 7 is a schematic diagram indicating that embodiments may correspond to a single CDAC unit or a single sub-ADC unit.

Thus, with reference to FIG. 7, embodiments of the present invention may correspond to a single CDAC unit 390 (upper half) or a single sub-ADC unit 300 (lower half).

The sub-ADC unit 300 may comprise the CDAC unit 390. In such embodiments, the SAR control unit 340 may be considered control circuitry or a control unit (not explicitly shown). Similarly, with reference to FIG. 8, embodiments of the present invention may correspond to a plurality of CDAC units 390 (operating in an interleaved manner) controlled by control circuitry 400 (upper half) or a plurality of sub-ADC units 300 (operating in an interleaved manner) controlled by control circuitry 440 (lower half). The sub-ADC units 300 may each comprise a CDAC unit 390. In such embodiments, the control circuitry 400, 440 may be centralised (as shown) or distributed by being for example implemented in control circuitry per CDAC unit or sub-ADC unit (effectively, corresponding to the SAR control unit 340).

Figure 8:
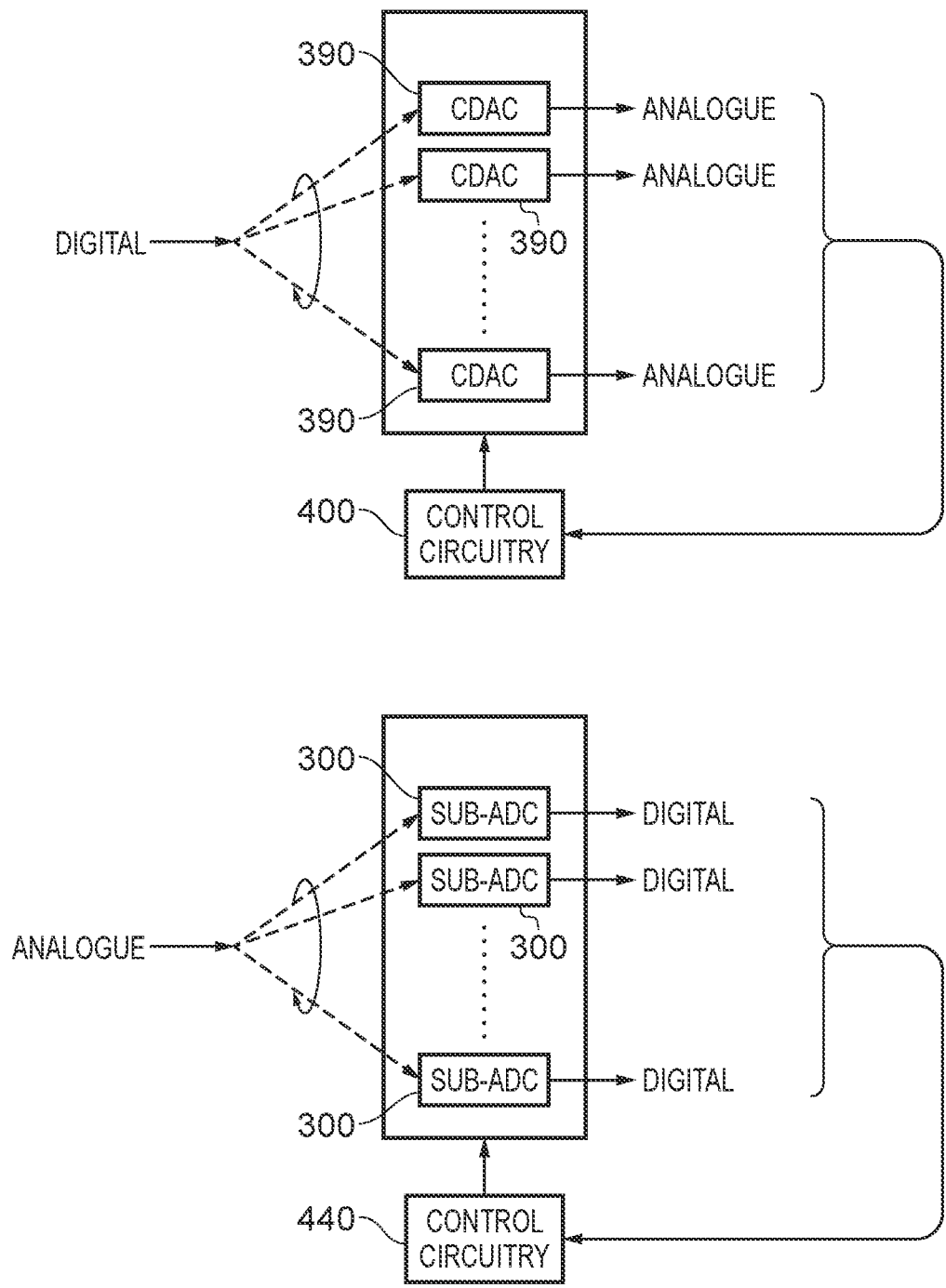
FIG. 8 is a schematic diagram indicating that embodiments may correspond to a plurality of CDAC units or a plurality of sub-ADC units.

For convenience of explanation, the following description will focus on sub-ADC units 300 in line with the lower half of FIGS. 7 and 8, however it will be appreciated that embodiments focusing on sub-ADC units 300 may be considered as embodiments focusing on CDAC units 390 since each sub-ADC unit 300 comprises a CDAC unit 390.

Before considering a detailed embodiment, a problem associated with sub-ADC units 300 will be considered. It will be appreciated, with reference to FIG. 5, that the problem is particularly associated with the CDAC 390 and thus that an equivalent problem is associated with CDAC units 390.

Figure 9:
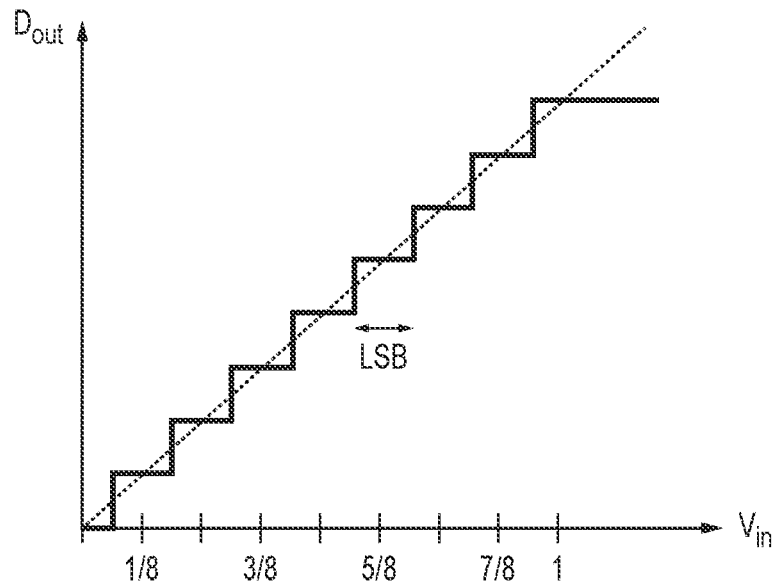
FIGS. 9 and 10 are graphs useful for understanding the basic concept of an ADC.
Figure 10:
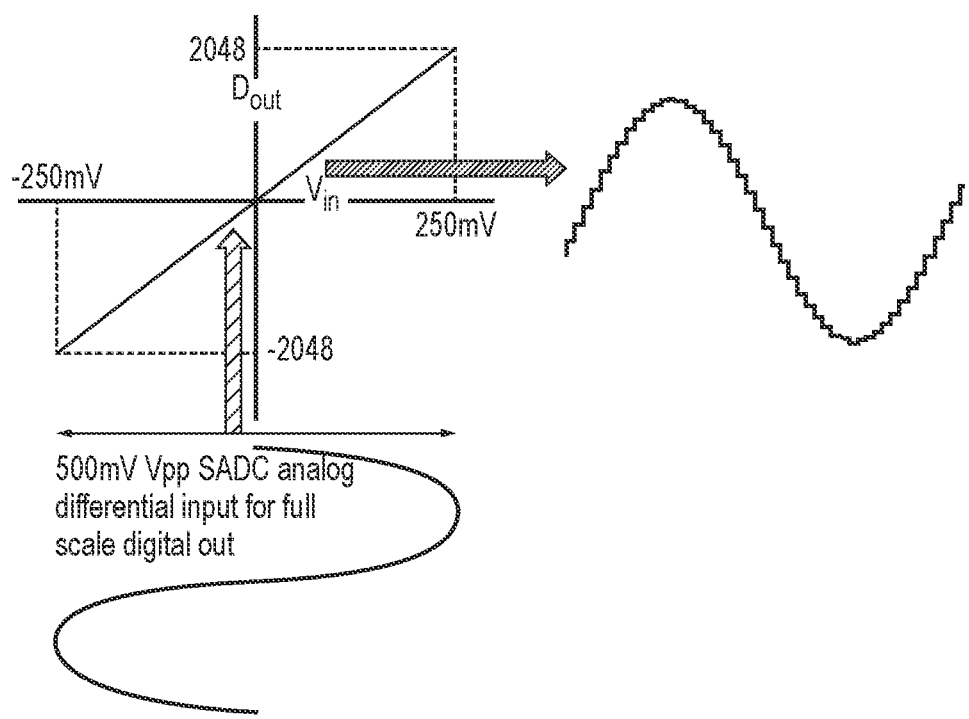

FIGS. 9 and 10 are graphs useful for understanding the basic concept of an ADC in that it converts an analogue sample Vin to a digital value Dout. In FIG. 9 only positive values of Vin are shown, whereas in FIG. 10 both positive and negative values are shown. The ranges of Vin and Dout shown are merely examples. As shown in FIG. 9, in an ideal case, linearly increasing values of Vin lead to the values of Dout increasing in discrete steps by one LSB each time per value of Vin which corresponds to 1 LSB. The ratio of the MSB(n)/MSB(n−1) in the CDAC needs to be exactly ½ to realize a binary weighted code. The gradient of the dotted line, which the stepped conversion trace approximates, corresponds to the gain of the ADC and this will be considered later herein.

Linearity/SFDR (spurious-free dynamic range) of an ADC is most impacted by its MSB bit with diminishing impact going down to MSB-1, MSB-2 etc. Here, SFDR could be understood to mean the strength ratio of the fundamental signal to the strongest spurious signal in the output. For example, with a 4-bit ADC, when the code changes from 0111 to 1000, a voltage proportional to the MSB replaces a voltage proportional to the 3 least significant bits. In a SAR ADC using a CDAC (as in FIG. 5), this means that the MSB capacitor size needs to be exactly 1 LSB more than the sum of the 3 least significant bits in this 4-bit example. Any error in this changeover is the biggest error as the MSB capacitor (4C in FIG. 5) is the largest cap of the CDAC 390. Such an error would manifest itself as a "jump" or glitch in the traces of FIGS. 9 and 10 when the code changes from 0111 to 1000 (or from 1000 to 0111), and have a negative impact on the SFDR of the ADC. The linearity (DNL/INL), hence SFDR (harmonics only, not interleaving spurs) of the CDAC is most impacted by the MSB and MSB-1 capacitors, and hence these are mainly focused on later herein.

Although the ratios between capacitor sizes in the CDAC 390 from bit to bit are important, focus will be placed on the relative sizes of the MSB and MSB-1 capacitors as being of particular importance as above. In a practical implementation, such capacitors will be configured to have nominal capacitances, however their actual capacitances may differ from their nominal capacitances due to process-related inaccuracies (and lead to SFDR problems).

A detailed embodiment will now be considered in connection with FIGS. 11 to 19, which could be considered together. The embodiment will be explained in the context of sub-ADC units 300 for convenience, however, as above (see FIG. 8) the embodiment may also be understood in the context of CDAC units 390.

Figure 11:
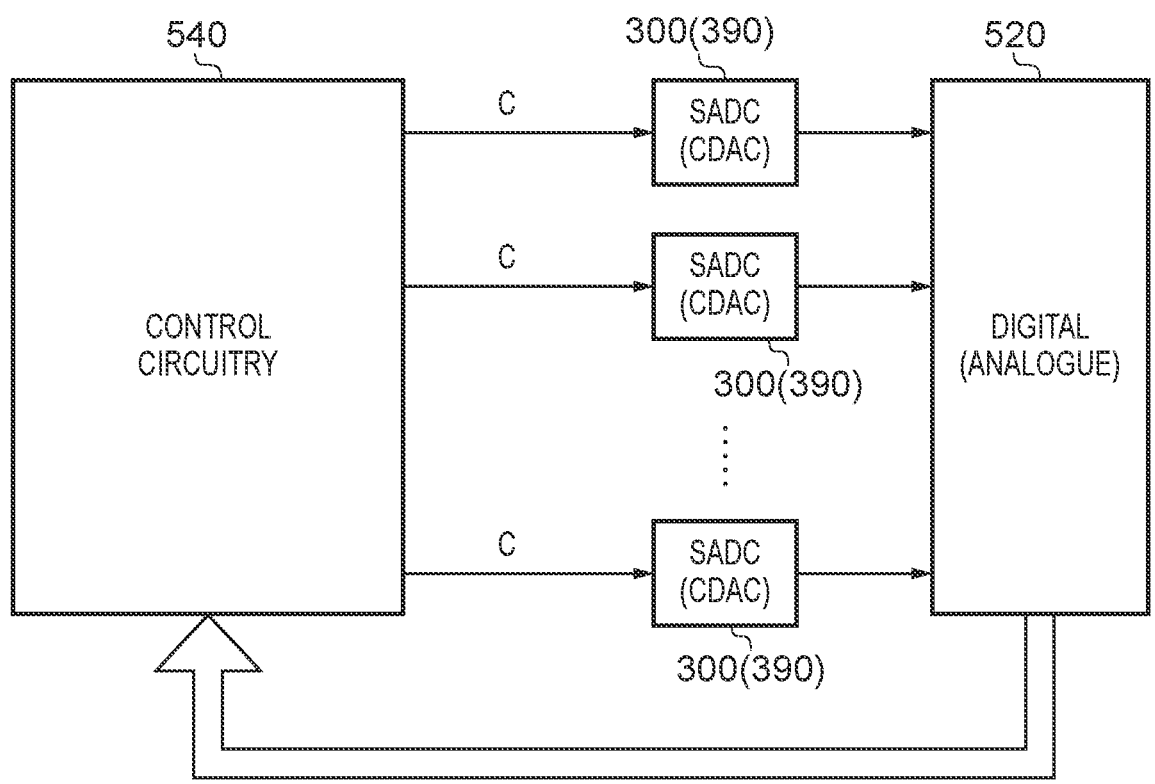
FIG. 11 is a schematic diagram of ADC (or mixed-signal) circuitry embodying the present invention.

FIG. 11 is a schematic diagram of ADC circuitry 500 embodying the present invention. The ADC circuitry 500 is configured to convert a series of analogue samples into a corresponding series of digital output values.

The ADC circuitry 500 comprises a set of sub-ADC units 300 for carrying out analogue-to-digital conversion operations to convert respective analogue samples into their corresponding digital output values, a digital unit 520 at which the digital output values are received from the sub-ADC units 300 and for example organised into a stream of digital output values, and control circuitry 540. The control circuitry 540 corresponds to the control circuitry 440 of FIG. 8. For simplicity, the provision of the analogue samples to the ADC circuitry 500 (in particular, to its sub-ADC units 300) is not explicitly shown.

As indicated in FIG. 11 in brackets, in an alternative embodiment the sub-ADC units 300 may be considered CDAC units 390, in which case the digital unit 520 may be considered an analogue unit 520 (and digital values may be supplied to the CDAC units 390) the control circuitry 540 may correspond to the control circuitry 400 of FIG. 8, and the circuitry 500 may be referred to as mixed-signal circuitry.

It is assumed here as a running example that each sub-ADC unit 300 is configured in line with FIG. 5, except that there are more bits in the MSB group so that the MSB and MSB-1 capacitors have intended nominal relative capacitance values 32C and 16C (rather than 4C and 2C), respectively. Also, although these capacitors are provided in pairs (for the differential circuitry), for simplicity those pairs will be considered as single capacitors in the following (so that a single-ended arrangement may also be considered) with the understanding that in the case of differential circuitry control may be applied to the pairs of capacitors.

Each sub-ADC unit 300 is thus configured for successive-approximation analogue-to-digital conversion and comprises an array of capacitors 370 at least some of which are configured to be individually-switched in a series of successive approximation operations per conversion of an analogue sample into its digital output value, the capacitors configured to have nominal capacitances.

In general, it is assumed that a given capacitor of the array of capacitors in each of the sub-ADC units (e.g. the MSB capacitor) is a target capacitor, that the set of sub-ADC units 300 comprises a plurality of sub-sets of sub-ADC units, and that at least one of the target capacitors per sub-set of sub-ADC units is a variable capacitor, controllable by the control circuitry 540 to have any one of a plurality of nominal capacitances defined by the configuration of that capacitor.

However, in the running example, to demonstrate "full" control of the MSB and MSB-1 capacitors, it is assumed that the MSB and MSB-1 capacitors in each of the sub-ADC units 300 are first and second target capacitors, respectively, and that all of the target capacitors per sub-set of sub-ADC units are variable capacitors, controllable by the control circuitry 540 to have any one of a plurality of nominal capacitances. In this regard, reference is made to FIG. 12.

Figure 12:
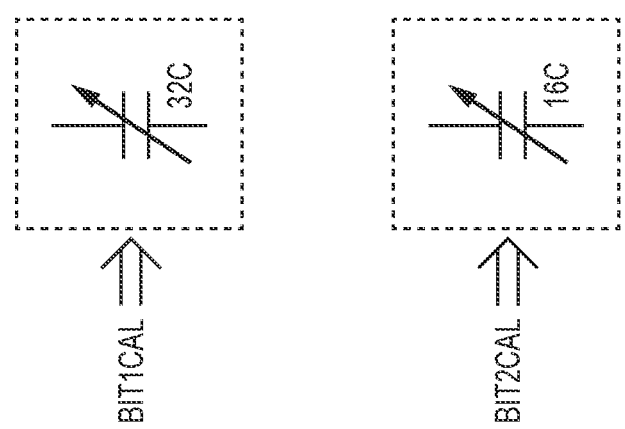
FIG. 12 is a schematic diagram useful for understanding control of MSB and MSB-1 capacitors.

FIG. 12 is a schematic diagram useful for understanding that, for each sub-ADC unit 300, the MSB and MSB-1 capacitors may be controlled by BIT1CAL and BIT2CAL control signals, respectively, provided by the control circuit 540 as the control signals C indicated in FIG. 11. That is, the control signals C in FIG. 12 may comprise BIT1CAL and/or BIT2CAL control signals (both of them in the running example). The capacitors may be configured to be variable in a similar manner as described later in connection with FIG. 20, i.e., using as an array of switched binary-weighted capacitors connected in parallel.

As above, in this example the MSB and MSB-1 capacitors have intended nominal capacitance values 32C and 16C. As variable capacitors, their nominal capacitances can thus be set to one of an example set of 5 possible values chosen to centre on their target values as in FIG. 12. Thus, for the MSB capacitors, the BIT1CAL signal may be employed to set their nominal capacitances to any of relative values 30C, 31C, 32C, 33C, 34C. Similarly, for the MSB-1 capacitors, the BIT2CAL signal may be employed to set their nominal capacitances to any of relative values 14C, 15C, 16C, 17C, 18C.

In this example, the pluralities of nominal capacitances of the MSB capacitors which are variable capacitors all span the same target nominal capacitance, or have the same average capacitance, or are evenly spaced from one another in terms of capacitance.

Indeed, in this example the pluralities of nominal capacitances of the MSB capacitors which are variable capacitors are substantially the same as one another. The same is true for the MSB-1 capacitors in this example. However, in other arrangements there may be differences between the configurations of the variable capacitors.

The control circuitry 540 is configured to operate in a test mode, and then in an operational mode.

In the test mode, the control circuitry 540 is configured to control the variable capacitors so that the set of sub-ADC units is configured into each of a plurality of different test configurations in turn, and measure the performance of the ADC circuitry 500 based on the series of digital output values in each of the test configurations. In the operational mode (following the test mode), control circuitry 540 is configured to configure the set of sub-ADC units into one of the set of test configurations based on the measured performances.

Each test configuration configures the variable capacitors so that, per sub-set of sub-ADC units, an average (or total) nominal capacitance of the target capacitors has a given value defined by that test configuration. The grouping of the set of sub-ADC units 300 into sub-sets and the test configurations may be understood in connection with FIGS. 13 to 15.

FIG. 13 is a table useful for understanding the grouping of the set of sub-ADC units 300 into sub-sets. It is assumed, in the running example, that the set of sub-ADC units 300 may comprise 80 sub-ADC units 300, and that these may be grouped into sub-sets of 4 or 5 sub-ADC units 300. Both of these alternatives are shown in FIG. 13. With 4 sub-ADC units 300 per sub-set, the 80 sub-ADC units may be grouped into 20 sub-sets numbered SS1 to SS20 as shown. With 5 sub-ADC units 300 per sub-set, the 80 sub-ADC units may be grouped into 16 sub-sets numbered SS1 to SS16 as shown.

Here, whether a grouping of 4 or 5 is chosen, the number of sub-ADC units 300 per sub-set is the same across the set of sub-ADC units 300. In other arrangements it would be possible to have sub-sets of different sizes across the set of sub-ADC units 300.

The grouping into sub-sets of 4 or 5 sub-ADC units gives 16 or 20 sub-sets across the example set of 80 sub-ADC units. In general, it may be appropriate to have sub-sets of 2, 3, 4 or more sub-ADC units as long as there are several (e.g., 5, 10, or 15) or more sub-sets in the overall set of sub-ADC units.

Returning to FIG. 13, in each sub-set with 4 sub-ADC units 300, the sub-ADC units may be referred to as sub-ADC units SADC0 to SADC3. In each sub-set with 5 sub-ADC units 300, the sub-ADC units may be referred to as sub-ADC units SADC0 to SADC4.

As mentioned earlier, it is assumed here that the sub-ADC units 300 are organised into an order corresponding to their numbers 1 to 80 as in FIG. 13. For example, the series of analogue samples received by the ADC circuitry 500 may be distributed to the 80 sub-ADC units 300 one-by-one in their number order (recall FIG. 8). In the present example, the sub-sets comprise consecutive sub-ADC units 300 in that order, although this is not essential. For example, in another arrangement, the sub-sets could be interleaved relative to the order of sub-ADC units 300, so that for example, with each sub-set having 4 sub-ADC units 300, the first sub-set comprises sub-ADC units 1, 21, 41, 61, the second sub-set comprises sub-ADC units 2, 22, 42, 62, the third sub-set comprises sub-ADC units 3, 23, 43, 63, and so on and so forth.

FIGS. 14 and 15 are tables useful for understanding the nominal capacitances to which the MSB and MSB-1 capacitors may be set, per sub-set, for example different test configurations. FIG. 14 relates to sub-sets of 4 sub-ADC units 300 and FIG. 15 relates to sub-sets of 5 sub-ADC units 300.

Looking first and FIG. 14, 9 example test configurations are shown, with the nominal capacitances (and the average nominal capacitance per sub-set) for each of the MSB and MSB-1 capacitors indicated in bold for the test configurations 1, 5 and 9. As will be appreciated, the average capacitances (for MSB and for MSB-1) are different from test configuration to test configuration. Also, for a given test configuration (indeed, for all test configurations), the average MSB-1 capacitance per sub-set is set to be half the average MSB capacitance per sub-set, given the intended binary weighting.

Although the step size of the MSB trim is only 10, due to the array of 80 SADCs a smaller resolution is possible when looking at the averages. For example, looking at the 9 test configurations of FIG. 14, the step size in the MSB averages is 0.25 C. Looking back at FIG. 13, the grouping of 4 for sub-sets means sub-ADCs sub-ADCs 4n+1 (1, 5, 9 ...) have the same trim code, sub-ADCs 4n+2 have the same trim code and sub-ADCs 4n+3 have the same trim code. The trim code here corresponds to BIT1CAL and/or BIT2CAL (in the running example, both), depending on which capacitors are variable (i.e. trimmable).

Turning to FIG. 15, 11 example test configurations are shown, with the nominal capacitances (and the average nominal capacitance per sub-set) for each of the MSB and MSB-1 capacitors indicated in bold for the test configurations 1, 6 and 11. Again, the average capacitances are different from test configuration to test configuration. Also, for a given test configuration, the average MSB-1 capacitance per sub-set is set to be half the average MSB capacitance per sub-set, given the intended binary weighting.

Figure 16:
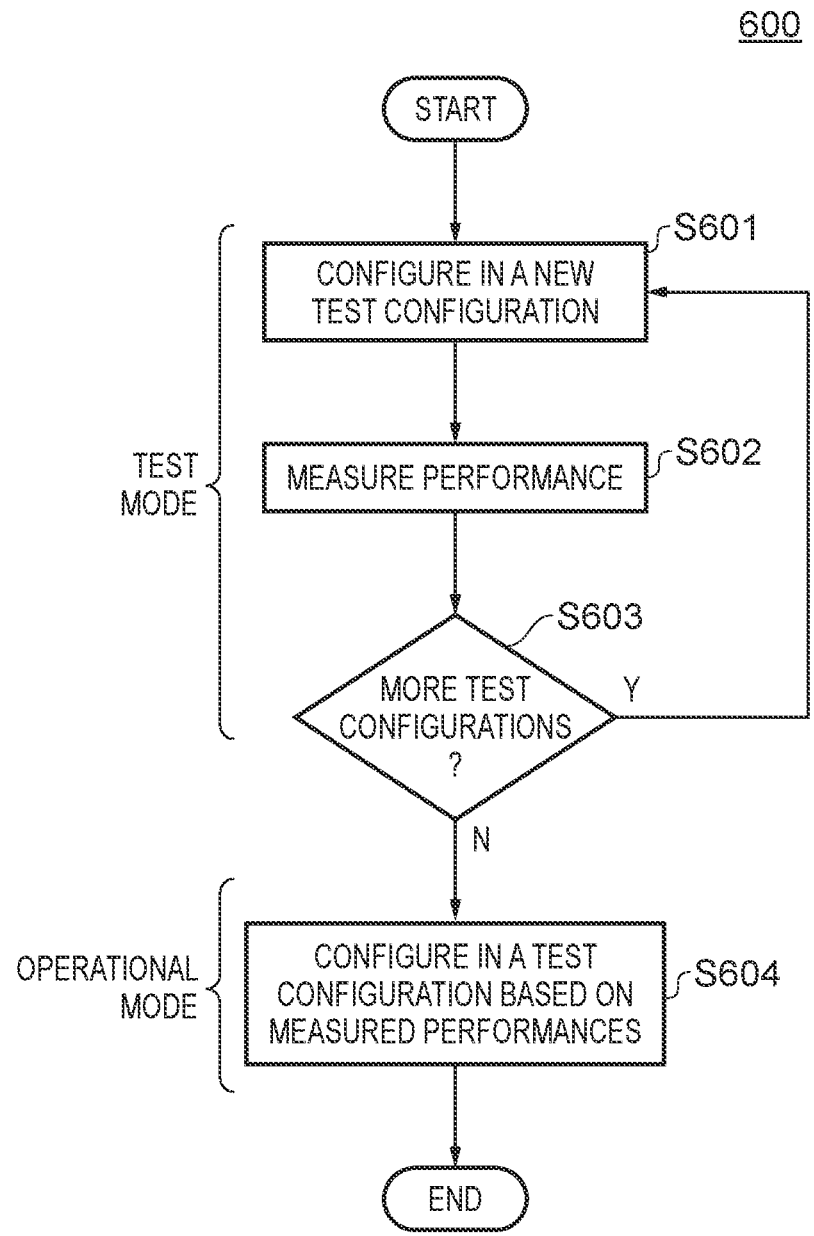
FIG. 16 is a flowchart of a method which may be carried out by the ADC circuitry of FIG. 11.

FIG. 16 is a flowchart of a method 600 which may be carried out by the ADC circuitry 500 and in particular its control circuitry 540. The method 600 comprises steps S601 to S604. Steps S601 to S603 correspond to the test mode, and step S604 corresponds to the operational mode.

In step S601, the variable capacitors are controlled so that the set of sub-ADC units is configured into a given test configuration, and in step S602 the performance of the ADC circuitry 500 (related to linearity) is measured based on the series of digital output values in that test configuration.

In step S603 it is determined if there are more test configurations which have not yet been employed in the test mode. If so (S603, Y), the method returns to step S601 where the variable capacitors are controlled so that the set of sub-ADC units is configured into a different (or new) test configuration and step S602 is repeated. If not (S603, N), the method proceeds to step S604.

In step S604, the set of sub-ADC units is configured into one of the test configurations based on the measured performances. For example, the set of sub-ADC units may be configured into the one of the test configurations which has the best measured performance, or into one of the test configurations which has a measured performance which meets a given performance specification.

Measuring the performance may comprise analysing a frequency spectrum of the series of digital output values (or the analogue output values in the case of CDAC units 390), such as determining the SFDR as mentioned earlier.

Figure 17:
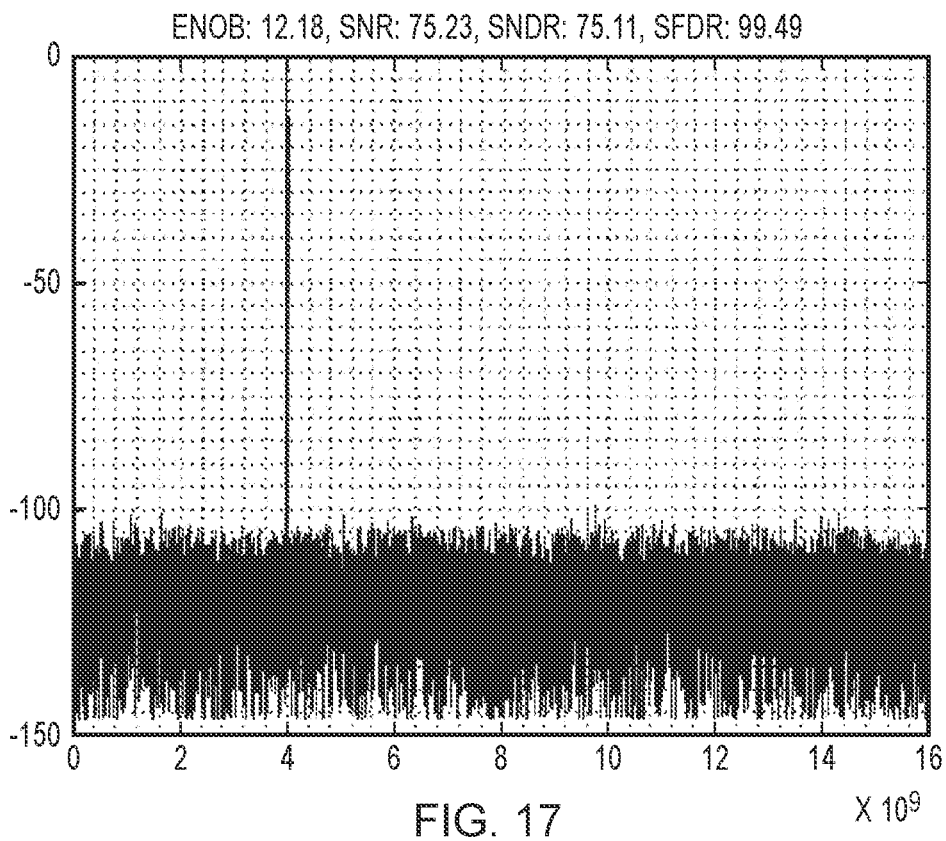
FIGS. 17 to 19 show performance measurements for three example test configurations.
Figure 18:
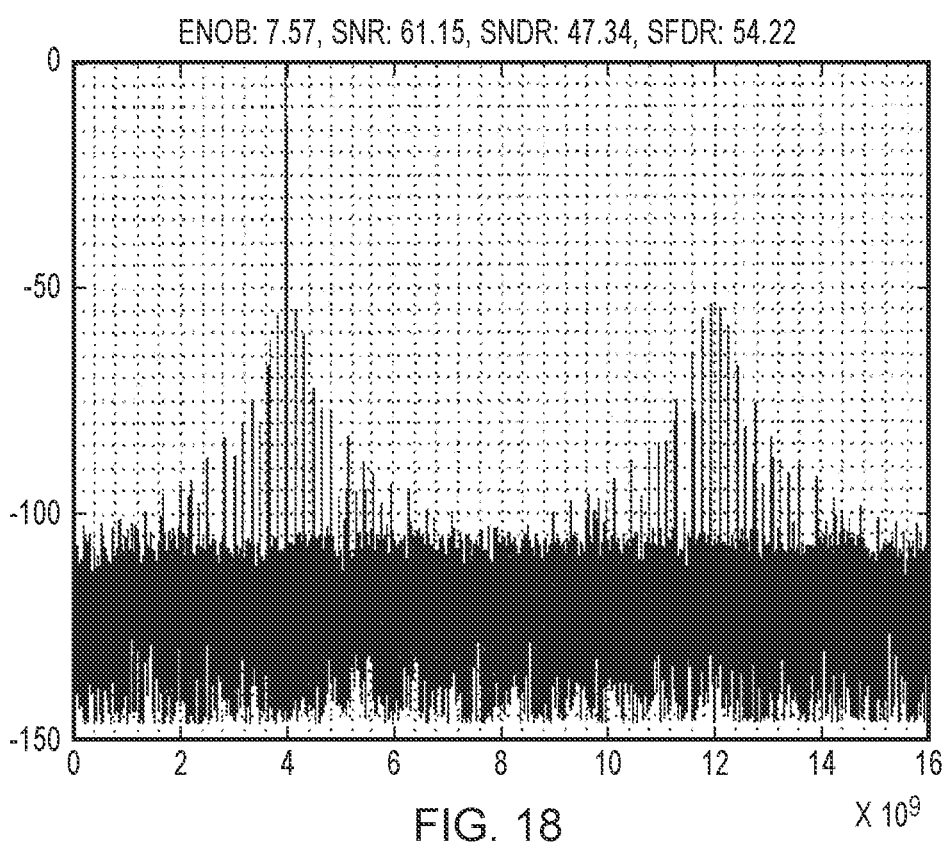
Figure 19:
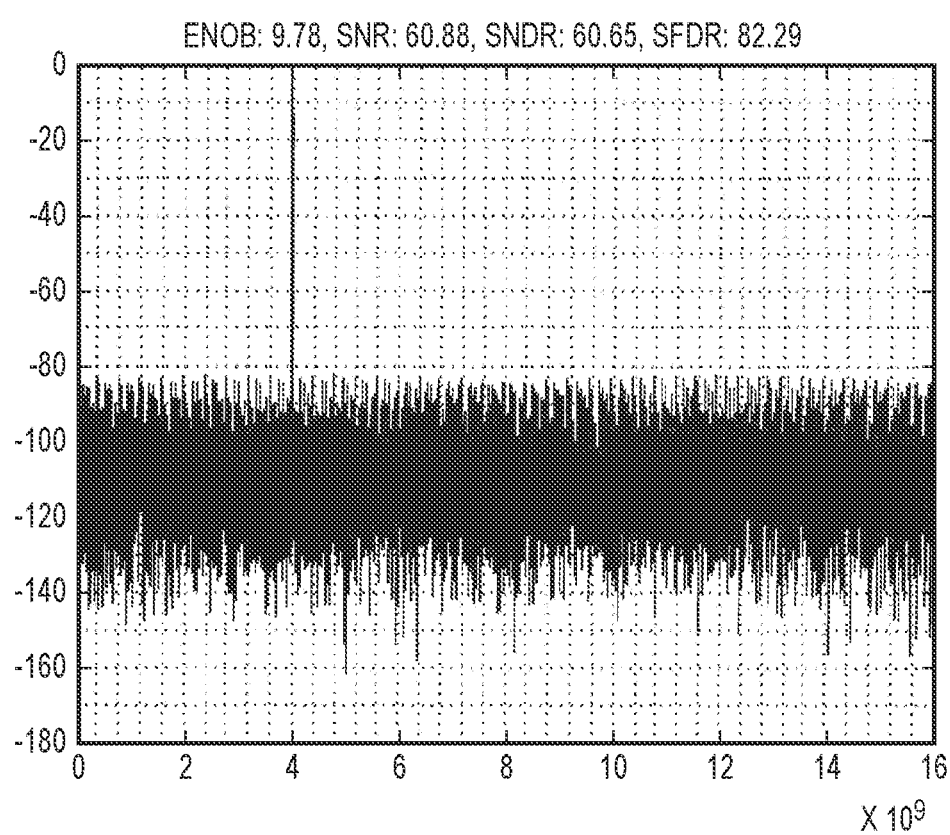

As mentioned above, it is not essential that both the MSB and MSB-1 capacitors are variable capacitors, or indeed that the variable capacitors are either of those capacitors. By way of example, FIGS. 17 to 19 show performance measurements (including SFDR values) for three example test configurations obtained by simulation, where only the MSB capacitors are variable capacitors and assuming 80 sub-ADC units with each sub-set comprising 4 sub-ADC units. Again, in this example the MSB and MSB-1 capacitors have intended nominal capacitance values 32C and 16C. As variable capacitors, the nominal capacitances in this case can be set to one of an example set of 6 possible values, in particular 30C, 31C, 32C, 33C, 34C, 35C. Because the results were obtained by simulation, the capacitors have their nominal capacitances as their actual capacitances. In the simulation, the sampling frequency Fs was 32 GHz.

In FIG. 17, all of the MSB capacitors are given the intended (i.e., ideal, for binary weighting) 32C value, and it can be seen that good linearity is achieved with an SFDR ~100 dBc. In FIG. 18, all of the MSB capacitors are given the 31C value (i.e., non-ideal, for binary weighting), and it can be seen that linearity is worsened significantly, with an SFDR ~54 dBc. In FIG. 19, per sub-set of 4 sub-ADC units, three of the sub-ADC units have MSB capacitors of 31C and one of them has MSB capacitors of 35C, so that the average MSB capacitance is 32C. Here it can be seen that the linearity is improved compared to FIG. 18, with an SFDR of ~82 dBc even though none of the MSB capacitors has the target or ideal 32C capacitance.

The method of averaging the weights per sub-set of sub-ADC (or CDAC) units, particularly the MSB and MSB-1 weights, across an array of interleaved sub-ADC (or CDAC) units enables improved overall linearity hence SFDR of the overall interleaved ADC (or DAC). Enabling improved overall linearity in this way avoids, for example, using larger capacitors (which are less sensitive to mismatch), or conversely enables smaller capacitors (which are more sensitive to mismatch) to be used. Silicon area can thus be more efficiently used (for example enabling approximately 10 to 20% savings per sub-ADC unit).

As mentioned earlier, in general it is assumed that a given capacitor of the array of capacitors in each of the sub-ADC units (e.g. the MSB capacitor) is a target capacitor, and that at least one of the target capacitors per sub-set of sub-ADC units is a variable capacitor. It may for example be that at least two or all of the target capacitors per sub-set of sub-ADC units are variable capacitors.

Looking back at FIG. 11 it will be appreciated that, where the ADC circuitry is implemented as integrated circuitry, the ADC circuitry (including the control circuitry 540) may be provided on a signal IC chip. However, in some arrangements the control circuitry 540 may be provided separately from the rest of the ADC circuitry 500 (i.e., off chip) as separate test and configuration equipment.

Returning to FIG. 9, it will be recalled that the gradient of the dotted line, which the stepped conversion trace approximates, corresponds to the gain of the ADC.

Taking the example of overall ADC circuitry having 80 sub-ADC units, mismatch in the gains of the sub-ADC units results in gain spurs at Fs/80+/−X.Fin, where X is a positive integer. This assumes the series of analogue samples are sampled at a sampling frequency Fs, and are samples of an input signal (e.g. having a single tone) having a frequency Fin. More generally, mismatch in the gains of the sub-ADC units results in gain spurs at Fs/N+/−X.Fin, where X is a positive integer and N is the number of sub-ADC units acting in a time-interleaved manner. Again, as before, gain of the CDAC units may equally be considered, but focus is retained on the sub-ADC units.

Such gain spurs manifest themselves as noise/distortion, degrading the SFDR, and it is thus desirable to reduce the size of them. Put another way, if the sub-ADC units have different gains $$\left(\text{nominal gain} = \frac{\text{Max digital code}}{\text{Max analog input voltage}}\right),$$

this shows up as spurs in the spectrum at $$\frac{Fs}{N} \pm Fin.$$

This can be thought of as Fin modulated by an error signal of $$\frac{Fs}{N}.$$

By reducing this gain mismatch the gain error can be reduced.

Digital gain calibration is complex (area & power) to implement at high speeds. Passive gain calibration is proposed here, which can be implemented in the sub-ADC units (and within the CDACs of those units). The approach varies capacitance (e.g. by adding/removing capacitors) of the CDAC thus adjusting the gain. By avoiding the need for a high-speed digital calibration unit, silicon area and power can be saved.

Looking back at FIGS. 5 and 6, and representing the capacitance of the gain-trim capacitors 374 as Cgaintrim and the capacitance of the capacitors 372 as Cpar for conve-nience, the total capacitance Ctot when all of the switched capacitors switch (looking at one of the positive and negative sides) may be considered 110 (4C+2C+C+C+C).

When the MSB cap switches, the corresponding charge transfer is proportional to:

$$\frac{4C}{Ctot + Cpar + Cgaintrim} \times V_{REF}$$

When all the switched capacitors are switched, the gain may be considered proportional to:

$$\frac{Ctot \times V_{REF}}{Ctot + Cpar + Cgaintrim}$$

In the following, gain is controlled therefore by adjusting (or trimming or calibrating) $V_{REF}$ and/or Cgaintrim.

Considering first a single sub-ADC unit 300, for example looking at the ADC circuitry of FIG. 5, it may be desirable to adjust (tune or trim) the gain to a target value.

Figure 20:
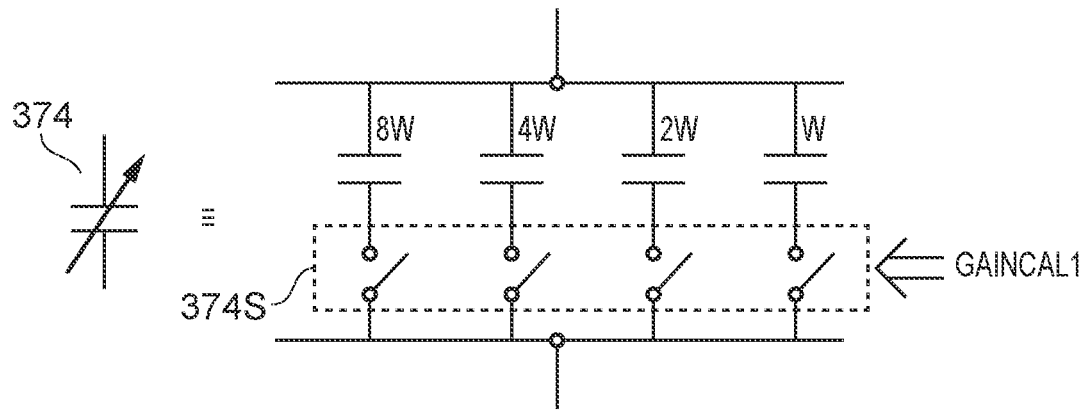
FIG. 20 is a schematic diagram useful for understanding control of the gain-trim capacitors of FIG. 5.

In a first technique, looking at FIG. 5, the differential pair of gain-trim capacitors 374 as mentioned earlier may be provided as variable capacitors. Looking at a single capacitor 374 for simplicity (but understanding the trimming to apply to the pair), FIG. 20 is a schematic diagram indicating that each capacitor may be implemented as an array of switched binary-weighted capacitors connected in parallel, with a GAINCAL1 control signal (forming part of the "Variable Capacitors" control signal in FIG. 5) controlling the switches 374S to control the nominal capacitance of the capacitor 374 according to the table. Of course, this is just one way of implementing a variable capacitor.

As indicated, the switched binary-weighted capacitors have example relative weights 8 W, 4 W, 2 W, W so that the GAINCAL1 signal can be used to generate nominal capacitances ranging in units of 1 W from 0W to 15 W.

Thus, in this first technique the SAR control unit 340 may act as control circuitry configured to carry out a calibration operation comprising determining the gain of the ADC circuitry 300 based on at least one analogue sample and the corresponding digital output value it generates, and, whilst determining the gain of the ADC circuitry 300, adjusting the determined gain towards or to a target value by adjusting the capacitance of the variable capacitor 374.

Figure 21:
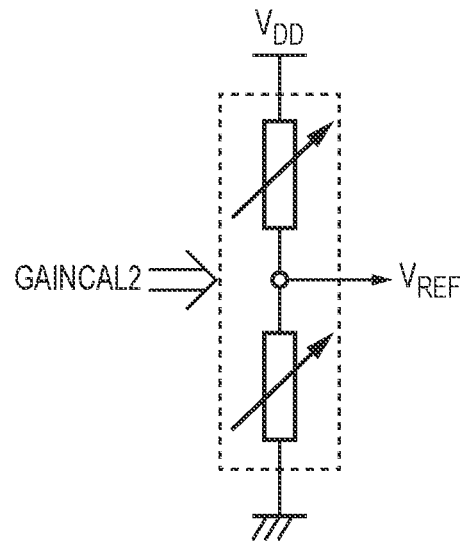
FIG. 21 is a schematic diagram useful for understanding control of the voltage levels output by the voltage reference source of FIG. 5.

In a second technique, looking again at FIG. 5, the voltage levels output by the voltage reference source 380 may be controllable. Taking the reference voltage $V_{REF}$ (see FIG. 6) as representative of these levels, and looking at FIG. 21, a GAINCAL2 control signal (forming the "$V_{REF}$" control signal in FIG. 5) may be used to control $V_{REF}$ and thus the voltage levels output by the voltage reference source 380.

Thus, in this second technique the SAR control unit 340 may act as control circuitry configured to carry out a calibration operation comprising determining the gain of the ADC circuitry 300 based on at least one analogue sample and the corresponding digital output value it generates, and, whilst determining the gain of the ADC circuitry 300, adjusting the determined gain towards or to a target value by adjusting the voltage level of the reference voltage signal $V_{REF}$.

Of course, either the first or second technique may be employed, or a combination of those techniques may be employed.

Figure 22:
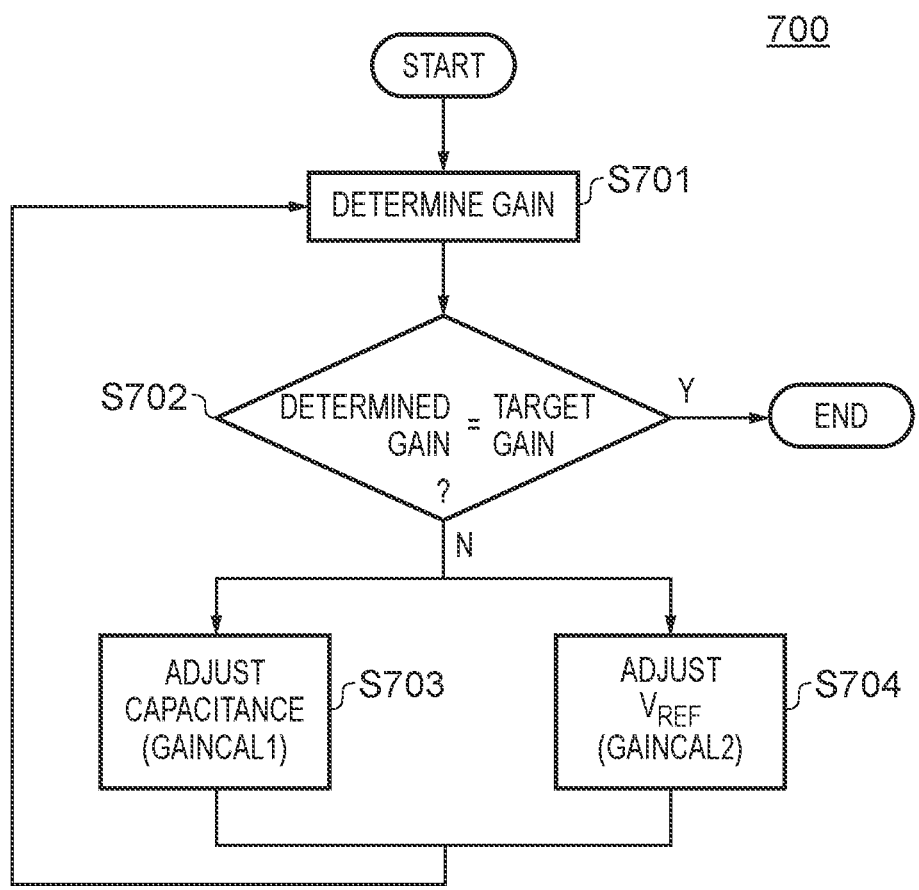
FIG. 22 is a flowchart of a method which may be carried out by the ADC circuitry of FIG. 5.

FIG. 22 is a flowchart of a method 700 which may be carried out by the ADC circuitry 300 and in particular its control circuitry 340. The method 700 comprises steps S701 to S704.

In step S701, the gain of the ADC circuitry 300 is determined based on at least one analogue sample and the corresponding digital output value it generates.

In step S702 it is determined if the determined gain substantially equals the target gain. If so (S702, Y), the method ends. Otherwise (S702, N), the method proceeds to one or both of steps S703 and S704 and then returns to step S701.

In step S703, the determined gain is adjusted towards or to the target gain by adjusting the capacitance of the variable capacitor 374 (e.g. using GAINCAL1). In step S704, the determined gain is adjusted towards or to the target gain by adjusting the voltage level of the reference voltage signal $V_{REF}$ (e.g. using GAINCAL2). Steps S703 and S704, when both are carried out, may be carried out sequentially or in parallel.

The gain may be measured by comparing analogue values and their corresponding digital output values. For example, the ADC circuitry 300 may be configured to convert a full-scale analogue value (e.g. +250 mV) into a corresponding digital output value (e.g. +2048, assuming an example 12-bit differential implementation). The control circuitry 340 may be configured to determine the gain of the ADC circuitry 300 based on analogue samples having a test analogue value, where the test analogue value is the same as the full-scale analogue value, or a lesser value (to enable trimming in both directions). The lesser value may be between 50% and 95% of the full-scale analogue value, or between 80% and 90% of the full-scale analogue value, for example.

The control circuitry 340 may thus be configured, in the calibration operation, to connect the ADC circuitry to receive analogue samples having the test analogue value, and/or obtain its analogue samples from a test DC analogue signal having the test analogue value.

It will be appreciated that the above control using GAINCAL1 and/or GAINCAL2 may be employed across a plurality of sub-ADC units 300. With reference to FIG. 11, for example, the above control using GAINCAL1 and/or GAINCAL2 may be applied by the control circuitry 540, with the control signals C being GAINCAL1 and/or GAINCAL2. It may for example be that all (or at least one) of the sub-ADC units 300 are calibrated/trimmed to have the same target gain value, to minimise gain mismatch between those sub-ADC units 300.

As another example, looking back at FIG. 11, the control circuitry 540 may be configured to operate in a test mode and then an operational mode (following the test mode) in connection with gain calibration.

For example, in the test mode, the control circuitry 540 may be configured to control the set of sub-ADC units 300 to configure them into each of a plurality of different test configurations in turn, and measure the effect of gain mismatch between the set of sub-ADC units (i.e., the performance) of the ADC circuitry based on the series of digital output values in each of the test configurations. In the operational mode following the test mode, the control circuitry 540 may be configured to configure the set of sub-ADC units 300 into one of the set of test configurations based on the measured effect of gain mismatch.

In this regard, control using GAINCAL1 and/or GAINCAL2 may be applied by the control circuitry 540, with the control signals C being GAINCAL1 and/or GAINCAL2, so that one or both of the first and second techniques described earlier may be employed. For example, in line with the first technique, for at least one of the sub-ADC units (or even all of them), the control circuitry 540 may be configured to control the capacitance of the variable capacitor 374 (using GAINCAL1) to configure the set of sub-ADC units into each of the plurality of different test configurations in turn. In line with the second technique, for at least one of the sub-ADC units (or even all of them), the control circuitry 540 may be configured to control the voltage level of the reference voltage signal $V_{REF}$ (using GAINCAL2) to configure the set of sub-ADC units into each of the plurality of different test configurations in turn.

Figure 23:
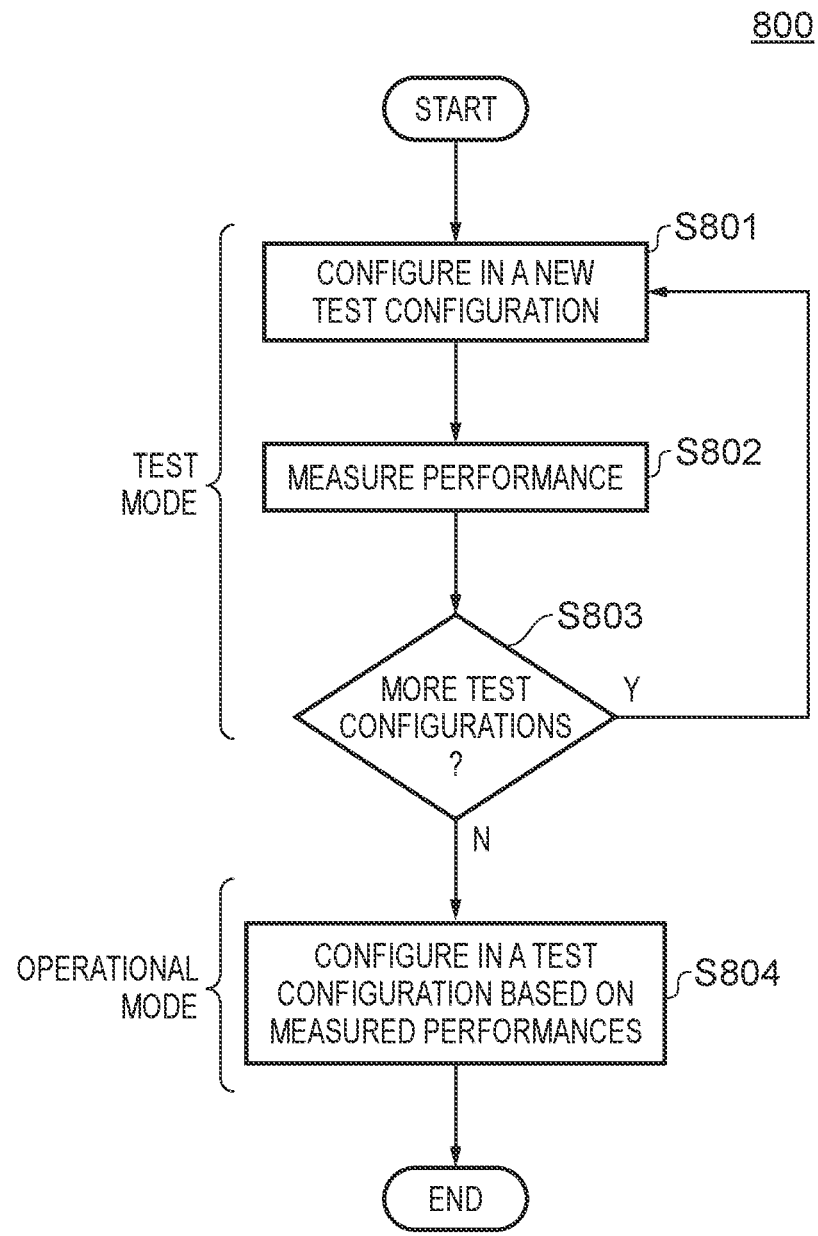
FIG. 23 is a flowchart of a method 800 which may be carried out by the ADC circuitry of FIG. 11.

FIG. 23 is a flowchart of a method 800 which may be carried out by the ADC circuitry 500 and in particular its control circuitry 540. The method 800 comprises steps S801 to S804. Steps S801 to S803 correspond to the test mode, and step S804 corresponds to the operational mode.

In step S801, the GAINCAL1 and/or GAINCAL2 signals may be controlled so that the set of sub-ADC units is configured into a given test configuration, and in step S802 the performance of the ADC circuitry 500 (related to gain mismatch) is measured based on the series of digital output values in that test configuration.

In step S803 it is determined if there are more test configurations which have not yet been employed in the test mode. If so (S803, Y), the method returns to step S801 where the variable capacitors are controlled so that the set of sub-ADC units is configured into a different (or new) test configuration and step S802 is repeated. If not (S803, N), the method proceeds to step S804.

In step S804, the set of sub-ADC units is configured into one of the test configurations based on the measured performances. For example, the set of sub-ADC units may be configured into the one of the test configurations which has the best measured performance, or into one of the test configurations which has a measured performance which meets a given performance specification.

Measuring the performance (in terms of gain mismatch) may comprise analysing a frequency spectrum of the series of digital values, such as determining a magnitude of at least one gain spur which is indicative of gain mismatch. For example, the series of analogue samples may be sampled at a sampling frequency Fs, and be samples of a test input signal (e.g. having a single tone) having a frequency Fin. The analogue samples may be distributed to the set of sub-ADC units 300 one-by-one in turn so that each sub-ADC unit has a sampling rate of Fs/N, where the set of sub-ADC units comprises N sub-ADC units. The at least one gain spur may be at least one of the spurs at (Fs/N)+/− integer multiples of Fin.

Measuring the performance (in terms of gain mismatch) may additionally or alternatively comprise analysing a frequency spectrum of the series of digital values, such as determining an SFDR value.

In the operational mode following the test mode, the control circuitry 540 may configure the set of sub-ADC units into one of the set of test configurations for which the magnitude of the at least one gain spur is minimised. The control circuitry 540 may be configured to carry out the method 800 for different test input signals having different frequencies Fin.

The different test configurations of method 800 may involve grouping the sub-ADC units 300 into sub-sets of, for example, 4 or 5 sub-ADC units in line with FIG. 13. In that case, the different test configurations could involve different combinations of GAINCAL1 and/or GAINCAL2 which are applied in the same way to each sub-set. For example, in each of FIGS. 14 and 15 the MSB nominal capacitance values could be replaced by GAINCAL1 values and the MSB-1 nominal capacitance values could be replaced by GAINCAL2 values, but without there needing to be a ratio link between averages of GAINCAL1 values and GAIN-CAL2 values per test configuration. For example, each test configuration may become a line in the table concerned, with each line being different. Either half (GAINCAL1 or GAIN-CAL2) of the table concerned may be used when configuring the set of sub-ADC units into one of the set of test configurations, or both halves (GAINCAL1 and GAIN-CAL2) may be used.

Figure 24:
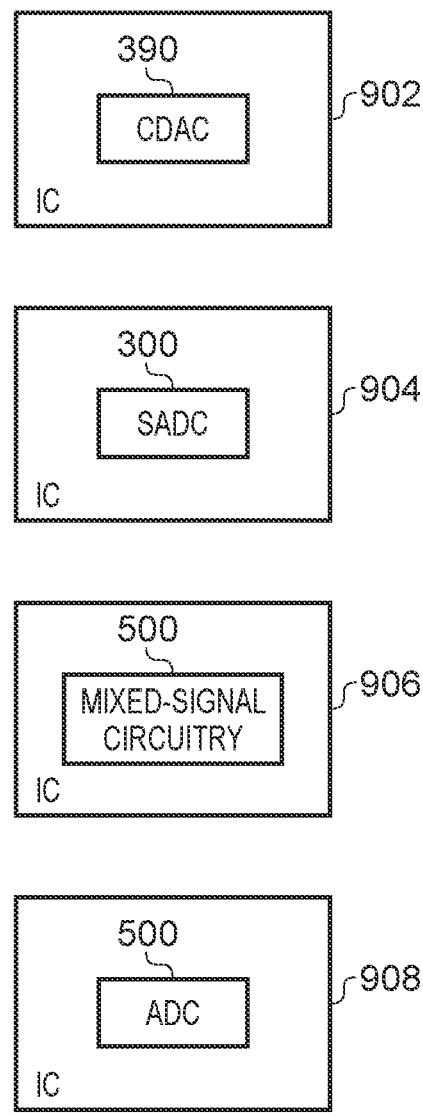
FIG. 24 is a schematic diagram of integrated circuits or integrated circuitry embodying the present invention.

FIG. 24 is a schematic diagram of integrated circuits (or circuitry) 902, 904, 906 and 908 each embodying the present invention. Such integrated circuitry may comprise a CDAC unit 390, an ADC unit or sub-ADC unit 300, or an ADC or mixed-signal circuitry 504 as described herein. Such integrated circuitry may be representative of some or all of an IC chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many different ways in the light of the above disclosure, within the spirit and scope of the appended claims.

The present disclosure extends to the following numbered statements:

A.

A1. Analogue-to-digital converter, ADC, circuitry for converting a series of analogue samples into a corresponding series of digital output values, the ADC circuitry comprising:
- a set of sub-ADC units for carrying out analogue-to-digital conversion operations to convert respective said analogue samples into their corresponding digital output values; and
- control circuitry, wherein:
- each sub-ADC unit is configured for successive-approximation analogue-to-digital conversion and comprises an array of capacitors at least some of which are configured to be individually-switched in a series of successive approximation operations per conversion of an analogue sample into its digital output value, the capacitors configured to have nominal capacitances;
- a given capacitor of the array of capacitors in each of the sub-ADC units is a target capacitor;
- the set of sub-ADC units comprises a plurality of sub-sets of sub-ADC units;
- at least one of the target capacitors per sub-set of sub-ADC units is a variable capacitor, controllable by the control circuitry to have any one of a plurality of nominal capacitances defined by the configuration of that capacitor; and
- the control circuitry is configured to:
  - in a test mode, control the variable capacitors so that the set of sub-ADC units is configured into each of a plurality of different test configurations in turn, and measure the performance of the ADC circuitry based on the series of digital output values in each of the test configurations, each test configuration configuring the variable capacitors so that, per sub-set of sub-ADC units, an average (or total) nominal capacitance of the target capacitors has a given value defined by that test configuration; and
  - in an operational mode following the test mode, configure the set of sub-ADC units into one of the set of test configurations based on the measured performances.

A2. ADC circuitry according to statement A1, wherein measuring the performance comprises analysing a frequency spectrum of the series of digital output values, such as determining a spurious free dynamic range.

A3. ADC circuitry according to statement A1 or A2, wherein the average nominal capacitance value of the target capacitors per sub-set of sub-ADC units is different for the different test configurations.

A4. ADC circuitry according to any of statements A1 to A3, wherein, at least two or all of the target capacitors per sub-set of sub-ADC units are variable capacitors, each controllable by the control circuitry to have any one of a plurality of nominal capacitances defined by the configuration of that capacitor.

A5. ADC circuitry according to statement A4, wherein the pluralities of nominal capacitances of the target capacitors which are variable capacitors all span the same target nominal capacitance, or have the same average capacitance, or are evenly spaced from one another in terms of capacitance.

A6. ADC circuitry according to statement A4 or A5, wherein the pluralities of nominal capacitances of the target capacitors which are variable capacitors are substantially the same as one another.

A7. ADC circuitry according to any of statements A1 to A6, wherein the target capacitor has:
- the highest capacitance of the array of capacitors for each of the sub-ADC units; or
- the second highest capacitance of the array of capacitors for each of the sub-ADC units;
- or the lowest capacitance of the array of capacitors for each of the sub-ADC units.

A8. ADC circuitry according to any of statements A1 to A7, wherein:
- the target capacitor of each of the sub-ADC units is a first target capacitor of each of the sub-ADC units, and another capacitor of the array of capacitors in each of the sub-ADC units is a second target capacitor;
- at least one of the second target capacitors per sub-set of sub-ADC units is a variable capacitor, controllable by the control circuitry to have any one of a plurality of nominal capacitances defined by the configuration of that capacitor; and
- each test configuration configures the variable capacitors so that, per sub-set of sub-ADC units, an average nominal capacitance of the first target capacitors has a first given value and an average nominal capacitance of the second target capacitors has a second given value defined by that test configuration.

A9. ADC circuitry according to statement A8, wherein:
- for each sub-ADC unit, the series of successive approximation operations comprises a first approximation operation followed by a second approximation operation and the array of capacitors comprises a first capacitor for switching in the first approximation operation and a second capacitor for switching in the second approximation operation; and
- for each of the sub-ADC units, the first capacitor is the first target capacitor and the second capacitor is the second target capacitor.

A10. ADC circuitry according to statement A8 or A9, wherein, for each of the sub-ADC units, the first target capacitor and the second target capacitor have:
the highest and second highest capacitances, respectively, of the array of capacitors; or
the second highest and third highest capacitances, respectively, of the array of capacitors.

A11. ADC circuitry according to any of statements A8 to A10, wherein at least two or all of the second target capacitors per sub-set of sub-ADC units are variable capacitors, each controllable by the control circuitry to have any one of a plurality of nominal capacitances defined by the configuration of that capacitor.

A12. ADC circuitry according to statement A11, wherein the pluralities of nominal capacitances of the second target capacitors which are variable capacitors all span the same target nominal capacitance, or have the same average capacitance, or are evenly spaced form one another in terms of capacitance.

A13. ADC circuitry according to statement A11 or A12, wherein the pluralities of nominal capacitances of the second target capacitors which are variable capacitors are substantially the same as one another.

A14. ADC circuitry according to any of statements A8 to A13, wherein for the sub-ADC units where the first and/or second capacitor is a variable capacitor, a ratio between the nominal or target nominal capacitance of the first capacitor and the nominal or target nominal capacitance of the second capacitor is within Y % of the same defined value, where $Y \leq 20$, or $Y \leq 10$, or $Y \leq 5$.

A15. ADC circuitry according to any of statements A8 to A14, wherein the average nominal capacitance value of the second target capacitors per sub-set of sub-ADC units is different for the different test configurations.

A16. ADC circuitry according to any of statements A8 to A15, wherein a ratio between the average nominal capacitance of the first target capacitors and the average nominal capacitance of the second target capacitors per sub-set of sub-ADC units is within X % of the same defined value in a plurality or all of the test configurations, where $X \leq 20$, or $X \leq 10$, or $X \leq 5$.

A17. ADC circuitry according to any of statements A8 to A16, wherein a ratio between the average nominal capacitance of the first target capacitors and the average nominal capacitance of the second target capacitors is substantially the same in a plurality or all of the test configurations.

A18. ADC circuitry according to any of statements A1 to A17, wherein the sub-sets of ADC units comprise the same number of sub-ADC units as one another.

A19. ADC circuitry according to any of statements A1 to A18, wherein, for each test configuration, the nominal capacitances of the respective target capacitors, or first target capacitors, or second target capacitors are the same for each sub-set of sub-ADC units.

A20. ADC circuitry according to any of statements A1 to A19, wherein:
the set of sub-ADC units comprises T sub-ADC units;
each sub-set of sub-ADC units comprises G sub-ADC units;
the set of sub-ADC units comprises N sub-sets of sub-ADC units, where $N=T/G$; and
T, G and N are integers.

A21. ADC circuitry according to statement A20, wherein: $N \geq 5$, or $N \geq 10$, or $N \geq 15$ or $N \geq 20$; and/or $G \geq 4$, or $G \geq 5$ or $G \geq 20$.

A22. ADC circuitry according to any of statements A1 to A21, wherein:
the set of sub-ADC units are organised into an order and are configured to convert respective said analogue samples into their corresponding digital output values in that order, optionally in a time-interleaved manner; and
each sub-set of ADC units comprises consecutive sub-ADC units in that order.

A23. ADC circuitry according to any of statements A1 to A22, implemented as integrated circuitry, wherein the set of sub-ADC units and the control circuitry are on the same IC chip as one another.

A24. Integrated circuitry, such as an IC chip, comprising ADC circuitry according to any of statements A1 to A23.

A25. A method of configuring analogue-to-digital converter, ADC, circuitry, the ADC circuitry for converting a series of analogue samples into a corresponding series of digital values, the ADC circuitry comprising:
a set of sub-ADC units for carrying out analogue-to-digital conversion operations to convert respective said analogue samples into their corresponding digital values,
wherein:
each sub-ADC unit is configured for successive-approximation analogue-to-digital conversion and comprises an array of capacitors at least some of which are configured to be individually-switched in a series of successive approximation operations per conversion of an analogue sample into its digital value, the capacitors configured to have nominal capacitances;
a given capacitor of the array of capacitors in each of the sub-ADC units is a target capacitor;
the set of sub-ADC units comprises a plurality of sub-sets of sub-ADC units; and
at least one of the target capacitors per sub-set of sub-ADC units is a variable capacitor, controllable to have any one of a plurality of nominal capacitances defined by the configuration of that capacitor,
the method comprising:
in a test mode, controlling the variable capacitors so that the set of sub-ADC units is configured into each of a plurality of different test configurations in turn, and measuring the performance of the ADC circuitry based on the series of digital values in each of the test configurations, each test configuration configuring the variable capacitors so that, per sub-set of sub-ADC units, an average (or total) nominal capacitance of the target capacitors has a given value defined by that test configuration; and
in an operational mode following the test mode, configuring the set of sub-ADC units into one of the set of test configurations based on the measured performances.

B.

B1. Mixed-signal circuitry comprising:
a set of capacitive digital-to-analogue converter, CDAC, units for carrying out digital-to-analogue conversion operations to convert respective digital values into corresponding analogue values; and
control circuitry,
wherein:
each CDAC unit comprises an array of capacitors at least some of which are configured to be individually-switched dependent on the digital values, the capacitors configured to have nominal capacitances;
a given capacitor of the array of capacitors in each of the CDAC units is a target capacitor;

the set of CDAC units comprises a plurality of sub-sets of CDAC units;

at least one of the target capacitors per sub-set of CDAC units is a variable capacitor, controllable by the control circuitry to have any one of a plurality of nominal capacitances defined by the configuration of that capacitor; and the control circuitry is configured to:

in a test mode, control the variable capacitors so that the set of CDAC units is configured into each of a plurality of different test configurations in turn, and measure the performance of the mixed-signal circuitry based on the analogue values in each of the test configurations, each test configuration configuring the variable capacitors so that, per sub-set of CDAC units, an average (or total) nominal capacitance of the target capacitors has a given value defined by that test configuration; and in an operational mode following the test mode, configure the set of CDAC units into one of the set of test configurations based on the measured performances.

B2. Mixed-signal circuitry according to statement B1, wherein measuring the performance comprises analysing a frequency spectrum of the analogue values, such as determining a spurious free dynamic range.

B3. Mixed-signal circuitry according to statement B1 or B2, wherein the average nominal capacitance value of the target capacitors per sub-set of CDAC units is different for the different test configurations.

B4. Mixed-signal circuitry according to any of statements B1 to B3, wherein, at least two or all of the target capacitors per sub-set of CDAC units are variable capacitors, each controllable by the control circuitry to have any one of a plurality of nominal capacitances defined by the configuration of that capacitor.

B5. Mixed-signal circuitry according to statement B4, wherein the pluralities of nominal capacitances of the target capacitors which are variable capacitors all span the same target nominal capacitance, or have the same average capacitance, or are evenly spaced from one another in terms of capacitance.

B6. Mixed-signal circuitry according to statement B4 or B5, wherein the pluralities of nominal capacitances of the target capacitors which are variable capacitors are substantially the same as one another.

B7. Mixed-signal circuitry according to any of statements B1 to B6, wherein the target capacitor has:

the highest capacitance of the array of capacitors for each of the CDAC units; or the second highest capacitance of the array of capacitors for each of the CDAC units;

or the lowest capacitance of the array of capacitors for each of the CDAC units.

B8. Mixed-signal circuitry according to any of statements B1 to B7, wherein:

the target capacitor of each of the CDAC units is a first target capacitor of each of the CDAC units, and another capacitor of the array of capacitors in each of the CDAC units is a second target capacitor;

at least one of the second target capacitors per sub-set of CDAC units is a variable capacitor, controllable by the control circuitry to have any one of a plurality of nominal capacitances defined by the configuration of that capacitor; and each test configuration configures the variable capacitors so that, per sub-set of CDAC units, an average nominal capacitance of the first target capacitors has a first given value and an average nominal capacitance of the second target capacitors has a second given value defined by that test configuration.

B9. Mixed-signal circuitry according to statement B8, wherein, at least two or all of the second target capacitors per sub-set of CDAC units are variable capacitors, each controllable by the control circuitry to have any one of a plurality of nominal capacitances defined by the configuration of that capacitor.

B10. Mixed-signal circuitry according to statement B9, wherein the pluralities of nominal capacitances of the second target capacitors which are variable capacitors all span the same target nominal capacitance, or have the same average capacitance, or are evenly spaced form one another in terms of capacitance.

B11. Mixed-signal circuitry according to statement B9 or B10, wherein the pluralities of nominal capacitances of the second target capacitors which are variable capacitors are substantially the same as one another.

B12. Mixed-signal circuitry according to any of statements B8 to B11, wherein for the CDAC units where the first and/or second capacitor is a variable capacitor, a ratio between the nominal or target nominal capacitance of the first capacitor and the nominal or target nominal capacitance of the second capacitor is within Y % of the same defined value, where $Y \leq 20$, or $Y \leq 10$, or $Y \leq 5$.

B13. Mixed-signal circuitry according to any of statements B8 to B12, wherein the average nominal capacitance value of the second target capacitors per sub-set of CDAC units is different for the different test configurations.

B14. Mixed-signal circuitry according to any of statements B8 to B13, wherein a ratio between the average nominal capacitance of the first target capacitors and the average nominal capacitance of the second target capacitors per sub-set of CDAC units is within X % of the same defined value in a plurality or all of the test configurations, where $X \leq 20$, or $X \leq 10$, or $X \leq 5$.

B15. Mixed-signal circuitry according to any of statements B8 to B14, wherein a ratio between the average nominal capacitance of the first target capacitors and the average nominal capacitance of the second target capacitors is substantially the same in a plurality or all of the test configurations.

B16. Mixed-signal circuitry according to any of statements B1 to B15, wherein the sub-sets of CDAC units comprise the same number of CDAC units as one another.

B17. Mixed-signal circuitry according to any of statements B1 to B16, wherein, for each test configuration, the nominal capacitances of the respective target capacitors, or first target capacitors, or second target capacitors are the same for each sub-set of CDAC units.

B18. Mixed-signal circuitry according to any of statements B1 to B17, wherein:

the set of CDAC units comprises T CDAC units;

each sub-set of CDAC units comprises G CDAC units;

the set of CDAC units comprises N sub-sets of CDAC units, where N=T/G; and

T, G and N are integers.

B19. Mixed-signal circuitry according to statement B18, wherein:

$N \geq 5$, or $N \geq 10$, or $N \geq 15$ or $N \geq 20$; and/or $G \geq 4$, or $G \geq 5$ or $G \geq 20$.

B20. Mixed-signal circuitry according to any of statements B1 to B19, wherein;

the set of CDAC units are organised into an order and are configured to convert respective said digital values into their corresponding analogue values in that order, optionally in a time-interleaved manner; and each sub-set of CDAC units comprises consecutive CDAC units in that order.

B21. Mixed-signal circuitry according to any of statements B1 to B22, implemented as integrated circuitry, wherein the set of CDAC units and the control circuitry are on the same IC chip as one another.

B22. Analogue-to-digital converter, ADC, circuitry for converting a series of analogue samples into a corresponding series of digital output values, the ADC circuitry comprising mixed-signal circuitry according to any of statements B1 to B21, wherein:

the set of CDAC units is a set of sub-ADC units for carrying out analogue-to-digital conversion operations to convert respective said analogue samples into their corresponding digital output values;

each sub-ADC unit is configured for successive-approximation analogue-to-digital conversion;

for each sub-ADC unit, its capacitors which are configured to be individually-switched are configured to be individually-switched in a series of successive approximation operations per conversion of an analogue sample into its digital output value, each successive approximation operation comprising the CDAC unit of the sub-ADC unit concerned converting a said digital value into its corresponding said analogue value;

the plurality of different test configurations are test configurations of the set of sub-ADC units;

the measured performances are of the ADC circuitry and are measured based on the series of digital output values; and the control circuitry is configured, in the operational mode following the test mode, to configure the set of sub-ADC units into one of the set of test configurations based on the measured performances.

B23. ADC circuitry according to statement B22, wherein measuring the performance comprises analysing a frequency spectrum of the series of digital output values, such as determining a spurious free dynamic range.

B24. ADC circuitry according to statement B22 or B23, wherein:

for each sub-ADC unit, the series of successive approximation operations comprises a first approximation operation followed by a second approximation operation and the array of capacitors comprises a first capacitor for switching in the first approximation operation and a second capacitor for switching in the second approximation operation; and for each of the sub-ADC units, the first capacitor is the first target capacitor and the second capacitor is the second target capacitor.

B25. ADC circuitry according to statement B24, wherein, for each of the sub-ADC units, the first target capacitor and the second target capacitor have:

the highest and second highest capacitances, respectively, of the array of capacitors; or the second highest and third highest capacitances, respectively, of the array of capacitors.

B26. ADC circuitry according to any of statements B22 to B25, implemented as integrated circuitry, wherein the set of sub-ADC units and the control circuitry are on the same IC chip as one another.

B27. Integrated circuitry, such as an IC chip, comprising the mixed-signal circuitry according to any of statements B1 to B21 or the ADC circuitry according to any of statements B22 to B26.

B28. A method of controlling mixed-signal circuitry, the mixed-signal circuitry comprising:

a set of capacitive digital-to-analogue converter, CDAC, units for carrying out digital-to-analogue conversion operations to convert respective digital values into corresponding analogue values, wherein:

each CDAC unit comprises an array of capacitors at least some of which are configured to be individually-switched dependent on the digital values, the capacitors configured to have nominal capacitances;

a given capacitor of the array of capacitors in each of the CDAC units is a target capacitor;

the set of CDAC units comprises a plurality of sub-sets of CDAC units;

at least one of the target capacitors per sub-set of CDAC units is a variable capacitor, controllable by the control circuitry to have any one of a plurality of nominal capacitances defined by the configuration of that capacitor; and the method comprises:

in a test mode, controlling the variable capacitors so that the set of CDAC units is configured into each of a plurality of different test configurations in turn, and measuring the performance of the mixed-signal circuitry based on the analogue values in each of the test configurations, each test configuration configuring the variable capacitors so that, per sub-set of CDAC units, an average (or total) nominal capacitance of the target capacitors has a given value defined by that test configuration; and in an operational mode following the test mode, configuring the set of CDAC units into one of the set of test configurations based on the measured performances.

C.

C1. Analogue-to-digital converter, ADC, circuitry for converting a series of analogue samples into a corresponding series of digital output values, the ADC circuitry comprising:

a set of sub-ADC units for carrying out analogue-to-digital conversion operations to convert respective said analogue samples into their corresponding digital output values; and control circuitry, wherein:

each sub-ADC unit is configured for successive-approximation analogue-to-digital conversion and comprises an array of capacitors at least some of which are configured to be individually-switched in a series of successive approximation operations per conversion of an analogue sample into its digital output value; and the control circuitry is configured to:

in a test mode, control the set of sub-ADC units to configure them into each of a plurality of different test configurations in turn, and measure the performance of the ADC circuitry based on the series of digital output values in each of the test configurations; and in an operational mode following the test mode, configure the set of sub-ADC units into one of the set of test configurations based on the measured performances, wherein:

for at least one of the sub-ADC units, a given capacitor of the array of capacitors is configured to be unswitched in the series of successive approximation operations and is a variable capacitor, and the control circuitry is configured to control the capacitance of the at least one variable capacitor to configure the set of sub-ADC units into each of the plurality of different test configurations in turn; and/or for at least one of the sub-ADC units, the capacitors of the array which are configured to be individually-switched are configured so that, when switched, a voltage level at one of the terminals of the capacitor concerned changes by an amount defined by a voltage level of a reference voltage signal, and the control circuitry is configured to control the voltage level of the reference voltage signal for the at least one of the sub-ADC units to configure the set of sub-ADC units into each of the plurality of different test configurations in turn.

C2. ADC circuitry according to statement C1, wherein measuring the performance comprises analysing a frequency spectrum of the series of digital values, such as:

determining a magnitude of at least one gain spur which is indicative of gain mismatch; and/or determining a spurious free dynamic range, optionally wherein measuring the performance comprises measuring the effect of gain mismatch between the set of sub-ADC units.

C3. ADC circuitry according to statement C2, wherein:

said series of analogue samples are sampled at a sampling frequency Fs, and are samples of a test input signal having a frequency Fin;

said analogue samples are distributed to the set of sub-ADC units one-by-one in turn so that each sub-ADC unit has a sampling rate of Fs/N, where the set of sub-ADC units comprises N sub-ADC units; and said at least one gain spur comprises at least one of the spurs at (Fs/N)+/− integer multiples of Fin.

C4. ADC circuitry according to statement C3, wherein the control circuitry is configured, in the operational mode following the test mode, to configure the set of sub-ADC units into one of the set of test configurations for which the magnitude of the at least one gain spur is minimised.

C5. ADC circuitry according to statement C3 or C4, wherein the control circuitry is configured to measure the performance for different test input signals having different frequencies Fin.

C6. ADC circuitry according to any of statements C1 to C5, wherein:

the set of sub-ADC units comprises a plurality of sub-sets of sub-ADC units;

for at least one of the sub-ADC units per sub-set, a given capacitor of the array of capacitors is configured to be unswitched in the series of successive approximation operations and is a variable capacitor, and the control circuitry is configured to control the capacitance of the at least one variable capacitor per sub-set, optionally in the same way per sub-set, to configure the set of sub-ADC units into each of the plurality of different test configurations in turn; and/or for at least one of the sub-ADC units per sub-set, the capacitors of the array which are configured to be individually-switched are configured so that, when switched, a voltage level at one of the terminals of the capacitor concerned changes by an amount defined by a voltage level of a reference voltage signal, and the control circuitry is configured to control the voltage level of the reference voltage signal for the at least one of the sub-ADC units per sub-set, optionally in the same way per sub-set, to configure the set of sub-ADC units into each of the plurality of different test configurations in turn.

C7. Integrated circuitry, such as an IC chip, comprising ADC circuitry according to any of statements C1 to C6.

C8. A method of controlling analogue-to-digital converter, ADC, circuitry, the ADC circuitry for converting a series of analogue samples into a corresponding series of digital output values, the ADC circuitry comprising:

a set of sub-ADC units for carrying out analogue-to-digital conversion operations to convert respective said analogue samples into their corresponding digital output values, wherein:

each sub-ADC unit is configured for successive-approximation analogue-to-digital conversion and comprises an array of capacitors at least some of which are configured to be individually-switched in a series of successive approximation operations per conversion of an analogue sample into its digital output value; and the method comprises:

in a test mode, controlling the set of sub-ADC units to configure them into each of a plurality of different test configurations in turn, and measuring the performance of the ADC circuitry based on the series of digital output values in each of the test configurations; and in an operational mode following the test mode, configuring the set of sub-ADC units into one of the set of test configurations based on the measured performances, wherein:

for at least one of the sub-ADC units, a given capacitor of the array of capacitors is configured to be unswitched in the series of successive approximation operations and is a variable capacitor, and the method comprises controlling the capacitance of the at least one variable capacitor to configure the set of sub-ADC units into each of the plurality of different test configurations in turn; and/or for at least one of the sub-ADC units, the capacitors of the array which are configured to be individually-switched are configured so that, when switched, a voltage level at one of the terminals of the capacitor concerned changes by an amount defined by a voltage level of a reference voltage signal, and the method comprises controlling the voltage level of the reference voltage signal for the at least one of the sub-ADC units to configure the set of sub-ADC units into each of the plurality of different test configurations in turn.

D.

D1. Mixed-signal circuitry comprising:

a set of capacitive digital-to-analogue converter, CDAC, units for carrying out digital-to-analogue conversion operations to convert respective digital values into corresponding analogue values; and control circuitry, wherein:

each CDAC unit comprises an array of capacitors at least some of which are configured to be individually-switched dependent on the digital values; and the control circuitry is configured to:

in a test mode, control the set of CDAC units to configure them into each of a plurality of different test configurations in turn, and measure the performance of the mixed-signal circuitry based on the analogue values in each of the test configurations; and in an operational mode following the test mode, configure the set of CDAC units into one of the set of test configurations based on the measured performances, wherein:
for at least one of the CDAC units, a given capacitor of the array of capacitors is configured to be unswitched dependent on the digital values and is a variable capacitor, and the control circuitry is configured to control the capacitance of the at least one variable capacitor to configure the set of CDAC units into each of the plurality of different test configurations in turn; and/or
for at least one of the CDAC units, the capacitors of the array which are configured to be individually-switched are configured so that, when switched, a voltage level at one of the terminals of the capacitor concerned changes by an amount defined by a voltage level of a reference voltage signal, and the control circuitry is configured to control the voltage level of the reference voltage signal for the at least one of the CDAC units to configure the set of CDAC units into each of the plurality of different test configurations in turn.

D2. Mixed-signal circuitry according to statement D1, wherein measuring the performance comprises analysing a frequency spectrum of the series of digital values, such as:
determining a magnitude of at least one gain spur which is indicative of gain mismatch; and/or
determining a spurious free dynamic range,
optionally wherein measuring the performance comprises measuring the effect of gain mismatch between the set of CDAC units.

D3. Mixed-signal circuitry according to statement D2, wherein:
said digital values have a sampling frequency Fs, and are samples of a test input signal having a frequency Fin;
said digital values are distributed to the set of CDAC units one-by-one in turn so that each CDAC unit has a sample rate of Fs/N, where the set of sub-ADC units comprises N sub-ADC units; and
said at least one gain spur comprises at least one of the spurs at (Fs/N)+/− integer multiples of Fin.

D4. Mixed-signal circuitry according to statement D3, wherein the control circuitry is configured, in the operational mode following the test mode, to configure the set of CDAC units into one of the set of test configurations for which the magnitude of the at least one gain spur is minimised.

D5. Mixed-signal circuitry according to statement D3 or D4, wherein the control circuitry is configured to measure the performance for different test input signals having different frequencies Fin.

D6. Mixed-signal circuitry according to any of the preceding statements, wherein:
the set of CDAC units comprises a plurality of sub-sets of CDAC units;
for at least one of the CDAC units per sub-set, a given capacitor of the array of capacitors is configured to be unswitched dependent on the digital values and is a variable capacitor, and the control circuitry is configured to control the capacitance of the at least one variable capacitor per sub-set, optionally in the same way per sub-set, to configure the set of CDAC units into each of the plurality of different test configurations in turn; and/or
for at least one of the CDAC units per sub-set, the capacitors of the array which are configured to be individually-switched are configured so that, when switched, a voltage level at one of the terminals of the capacitor concerned changes by an amount defined by a voltage level of a reference voltage signal, and the control circuitry is configured to control the voltage level of the reference voltage signal for the at least one of the CDAC units per sub-set, optionally in the same way per sub-set, to configure the set of CDAC units into each of the plurality of different test configurations in turn.

D7. ADC circuitry comprising the mixed-signal circuitry according to any of statements D1 to D6.

D8. Integrated circuitry, such as an IC chip, comprising the mixed-signal circuitry according to any of statements D1 to D6 or the ADC circuitry according to statement D7.

D9. A method of controlling mixed-signal circuitry, the mixed-signal circuitry comprising:
a set of capacitive digital-to-analogue converter, CDAC, units for carrying out digital-to-analogue conversion operations to convert respective digital values into corresponding analogue values,
wherein:
each CDAC unit comprises an array of capacitors at least some of which are configured to be individually-switched dependent on the digital values; and
the method comprises:
in a test mode, controlling the set of CDAC units to configure them into each of a plurality of different test configurations in turn, and measuring the performance of the mixed-signal circuitry based on the analogue values in each of the test configurations; and
in an operational mode following the test mode, configuring the set of CDAC units into one of the set of test configurations based on the measured performances,
wherein:
for at least one of the CDAC units, a given capacitor of the array of capacitors is configured to be unswitched dependent on the digital values and is a variable capacitor, and the method comprises controlling the capacitance of the at least one variable capacitor to configure the set of CDAC units into each of the plurality of different test configurations in turn; and/or
for at least one of the CDAC units, the capacitors of the array which are configured to be individually-switched are configured so that, when switched, a voltage level at one of the terminals of the capacitor concerned changes by an amount defined by a voltage level of a reference voltage signal, and the method comprises controlling the voltage level of the reference voltage signal for the at least one of the CDAC units to configure the set of CDAC units into each of the plurality of different test configurations in turn.

E.

E1. Analogue-to-digital converter, ADC, circuitry comprising:
an ADC unit for carrying out analogue-to-digital conversion operations to convert respective analogue samples into corresponding digital output values; and
control circuitry,
wherein:
the ADC unit is configured for successive-approximation analogue-to-digital conversion and comprises an array of capacitors at least some of which are configured to be individually-switched in a series of successive approximation operations per conversion of an analogue sample into its digital output value; and
the control circuitry is configured to carry out a calibration operation comprising:

determining the gain of the ADC unit based on the analogue samples and the corresponding digital output values it generates; and whilst determining the gain of the ADC unit, adjusting the determined gain towards or to a target value, wherein:

a given capacitor of the array of capacitors is configured to be unswitched in the series of successive approximation operations and is a variable capacitor, and the control circuitry is configured to adjust the determined gain by adjusting the capacitance of the variable capacitor; and/or the capacitors of the array which are configured to be individually-switched are configured so that, when switched, a voltage level at one of the terminals of the capacitor concerned changes by an amount defined by a voltage level of a reference voltage signal, and the control circuitry is configured to adjust the determined gain by adjusting the voltage level of the reference voltage signal.

E2. ADC circuitry according to statement E1, wherein:

the ADC unit is configured to convert a full-scale analogue value into a corresponding digital output value;

the control circuitry is configured to determine the gain of the ADC unit based on analogue samples having a test analogue value; and the test analogue value is:
the same as the full-scale analogue value; or
between 50% and 95% of the full-scale analogue value, or between 80% and 90% of the full-scale analogue value.

E3. ADC circuitry according to statement E1 or E2, wherein the control circuitry is configured, in the calibration operation, to connect the ADC unit to:

receive analogue samples having the test analogue value, and/or obtain its analogue samples from a test DC analogue signal having the test analogue value.

E4. ADC circuitry according to any of statements E1 to E3, comprising a plurality of said ADC units, wherein the control circuitry is configured to carry out a said calibration operation for each of the ADC units.

E5. ADC circuitry according to statement E4, wherein the target value is the same for each of the ADC units.

E6. Integrated circuitry, such as an IC chip, comprising ADC circuitry according to any of statements E1 to E5.

E7. A method of controlling analogue-to-digital converter, ADC, circuitry, the ADC circuitry comprising:

an ADC unit for carrying out analogue-to-digital conversion operations to convert respective analogue samples into corresponding digital output values, wherein:
the ADC unit is configured for successive-approximation analogue-to-digital conversion and comprises an array of capacitors at least some of which are configured to be individually-switched in a series of successive approximation operations per conversion of an analogue sample into its digital output value, wherein the method comprises:
carrying out a calibration operation comprising:
determining the gain of the ADC unit based on the analogue samples and the corresponding digital values it generates; and whilst determining the gain of the ADC unit, adjusting the determined gain towards or to a target value, wherein:
a given capacitor of the array of capacitors is configured to be unswitched in the series of successive approximation operations and is a variable capacitor, and the method comprises adjusting the determined gain by adjusting the capacitance of the variable capacitor; and/or the capacitors of the array which are configured to be individually-switched are configured so that, when switched, a voltage level at one of the terminals of the capacitor concerned changes by an amount defined by a voltage level of a reference voltage signal, and the method comprises adjusting the determined gain by adjusting the voltage level of the reference voltage signal.

F.

F1. Mixed-signal circuitry comprising:

a capacitive digital-to-analogue converter, CDAC, unit for carrying out digital-to-analogue conversion operations to convert respective digital values into corresponding analogue values; and control circuitry,
wherein:
the CDAC unit comprises an array of capacitors at least some of which are configured to be individually-switched dependent on the digital values; and the control circuitry is configured to carry out a calibration operation comprising:
determining the gain of the CDAC unit based on the digital values and the corresponding analogue values it generates; and whilst determining the gain of the ADC unit, adjusting the determined gain towards or to a target value, wherein:
a given capacitor of the array of capacitors is configured to be unswitched dependent on the digital values, and the control circuitry is configured to adjust the determined gain by adjusting the capacitance of the variable capacitor; and/or the capacitors of the array which are configured to be individually-switched are configured so that, when switched, a voltage level at one of the terminals of the capacitor concerned changes by an amount defined by a voltage level of a reference voltage signal, and the control circuitry is configured to adjust the determined gain by adjusting the voltage level of the reference voltage signal.

F2. Mixed-signal circuitry according to statement F1, wherein:

the CDAC unit is configured to convert a full-scale digital value into a corresponding analogue value;

the control circuitry is configured to determine the gain of the CDAC unit based on digital values having a test digital value; and the test digital value is:
the same as the full-scale digital value; or
between 50% and 95% of the full-scale digital value, or between 80% and 90% of the full-scale digital value.

F3. Mixed-signal circuitry according to statement F1 or F2, wherein the control circuitry is configured, in the calibration operation, to connect the CDAC unit to:

receive analogue samples having the test digital value, and/or obtain its digital values from a test digital signal having the test digital value.

F4. Mixed-signal circuitry according to any of statements F1 to F3, comprising a plurality of said CDAC units, wherein the control circuitry is configured to carry out a said calibration operation for each of the CDAC units.

F5. Mixed-signal circuitry according to statement F4, wherein the target value is the same for each of the CDAC units.

F6. ADC circuitry comprising the mixed-signal circuitry according to any of statements F1 to F5.

F7. Integrated circuitry, such as an IC chip, comprising the mixed-signal circuitry according to any of statements F1 to F5 or the ADC circuitry according to statement F6.

F8. A method of controlling mixed-signal circuitry, the mixed-signal circuitry comprising:
- a capacitive digital-to-analogue converter, CDAC, unit for carrying out digital-to-analogue conversion operations to convert respective digital values into corresponding analogue values, wherein:
- the CDAC unit comprises an array of capacitors at least some of which are configured to be individually-switched dependent on the digital values; and
- the method comprises carrying out a calibration operation comprising:
  - determining the gain of the CDAC unit based on the digital values and the corresponding analogue values it generates; and
  - whilst determining the gain of the ADC unit, adjusting the determined gain towards or to a target value, wherein:
- a given capacitor of the array of capacitors is configured to be unswitched dependent on the digital values, and the method comprises adjusting the determined gain by adjusting the capacitance of the variable capacitor; and/or
- the capacitors of the array which are configured to be individually-switched are configured so that, when switched, a voltage level at one of the terminals of the capacitor concerned changes by an amount defined by a voltage level of a reference voltage signal, and the method comprises adjusting the determined gain by adjusting the voltage level of the reference voltage signal.

The invention claimed is:

1. Mixed-signal circuitry comprising:
a set of capacitive digital-to-analogue converter, CDAC, units for carrying out digital-to-analogue conversion operations to convert respective digital values into corresponding analogue values; and
control circuitry,
wherein:
each CDAC unit comprises an array of capacitors at least some of which are configured to be individually-switched dependent on the digital values, the capacitors configured to have nominal capacitances;
a given capacitor of the array of capacitors in each of the CDAC units is defined as a target capacitor;
the set of CDAC units comprises a plurality of sub-sets of CDAC units;
at least one of the target capacitors per sub-set of CDAC units is a variable capacitor, controllable by the control circuitry to have any one of a plurality of nominal capacitances defined by a configuration of that capacitor; and
the control circuitry is configured to:
in a test mode, control the variable capacitors so that the set of CDAC units is configured into each of a plurality of different test configurations in turn, and measure the performance of the mixed-signal circuitry based on the analogue values in each of the test configurations, each test configuration configuring the variable capacitors so that, per sub-set of CDAC units, an average nominal capacitance of the target capacitors has a given value defined by that test configuration; and
in an operational mode following the test mode, configure the set of CDAC units into one of the plurality of different test configurations based on the measured performances.

2. Mixed-signal circuitry according to claim 1, wherein measuring the performance comprises analyzing a frequency spectrum of the analogue values, such as determining a spurious free dynamic range.

3. Mixed-signal circuitry according to claim 1, wherein, at least two or all of the target capacitors per sub-set of CDAC units are variable capacitors, each controllable by the control circuitry to have any one of a plurality of nominal capacitances defined by the configuration of that capacitor.

4. Mixed-signal circuitry according to claim 1, wherein:
the target capacitor of each of the CDAC units is a first target capacitor of each of the CDAC units, and another capacitor of the array of capacitors in each of the CDAC units is a second target capacitor;
at least one of the second target capacitors per sub-set of CDAC units is a variable capacitor, controllable by the control circuitry to have any one of a plurality of nominal capacitances defined by the configuration of that capacitor; and
each test configuration configures the variable capacitors so that, per sub-set of CDAC units, an average nominal capacitance of the first target capacitors has a first given value and an average nominal capacitance of the second target capacitors has a second given value defined by that test configuration.

5. Mixed-signal circuitry according to claim 4, wherein, at least two or all of the second target capacitors per sub-set of CDAC units are variable capacitors, each controllable by the control circuitry to have any one of a plurality of nominal capacitances defined by the configuration of that capacitor.

6. Mixed-signal circuitry according to claim 4, wherein a ratio between the average nominal capacitance of the first target capacitors and the average nominal capacitance of the second target capacitors is substantially the same in a plurality or all of the test configurations.

7. Analogue-to-digital converter, ADC, circuitry for converting a series of analogue samples into a corresponding series of digital output values, the ADC circuitry comprising mixed-signal circuitry according to claim 1, wherein:
the set of CDAC units is configured as a set of sub-ADC units each comprising a CDAC unit, the set of sub-ADC units for carrying out analogue-to-digital conversion operations to convert respective said analogue samples into their corresponding digital output values;
each sub-ADC unit is configured for successive-approximation analogue-to-digital conversion;
for each sub-ADC unit, its capacitors which are configured to be individually-switched are configured to be individually-switched in a series of successive approximation operations per conversion of an analogue sample into its digital output value, each successive approximation operation comprising the CDAC unit of the sub-ADC unit concerned converting a said digital value into its corresponding said analogue value;
the plurality of different test configurations are test configurations of the set of sub-ADC units;

the measured performances are of the ADC circuitry and are measured based on the series of digital output values; and the control circuitry is configured, in the operational mode following the test mode, to configure the set of sub-ADC units into one of the plurality of different test configurations based on the measured performances.

8. Integrated circuitry, such as an IC chip, comprising the mixed-signal circuitry according to the ADC circuitry according to claim 7.

9. ADC circuitry comprising the mixed-signal circuitry according to claim 1.

10. Integrated circuitry, such as an IC chip, comprising the mixed-signal circuitry according to claim 1.

11. Mixed-signal circuitry according to claim 1, wherein each sub-set of CDAC units is a group of CDAC units.

12. Mixed-signal circuitry comprising:

a set of capacitive digital-to-analogue converter, CDAC, units for carrying out digital-to-analogue conversion operations to convert respective digital values into corresponding analogue values; and control circuitry, wherein:

each CDAC unit comprises an array of capacitors at least some of which are configured to be individually-switched dependent on the digital values; and the control circuitry is configured to:

in a test mode, control the set of CDAC units to configure them into each of a plurality of different test configurations in turn, and measure the performance of the mixed-signal circuitry based on the analogue values in each of the test configurations; and in an operational mode following the test mode, configure the set of CDAC units into one of the plurality of different test configurations based on the measured performances, wherein:

for at least one of the CDAC units, a given capacitor of the array of capacitors is configured to be unswitched dependent on the digital values and is a variable capacitor, and the control circuitry is configured to control the capacitance of the at least one variable capacitor to configure the set of CDAC units into each of the plurality of different test configurations in turn; and/or for at least one of the CDAC units, the capacitors of the array which are configured to be individually-switched are configured so that, when switched, a voltage level at one of the terminals of the capacitor concerned changes by an amount defined by a voltage level of a reference voltage signal, and the control circuitry is configured to control the voltage level of the reference voltage signal for the at least one of the CDAC units to configure the set of CDAC units into each of the plurality of different test configurations in turn.

13. Mixed-signal circuitry according to claim 12, wherein measuring the performance comprises analyzing a frequency spectrum of the series of digital values, such as:

determining a magnitude of at least one gain spur which is indicative of gain mismatch; and/or determining a spurious free dynamic range, optionally wherein measuring the performance comprises measuring the effect of gain mismatch between the set of CDAC units.

14. Mixed-signal circuitry according to claim 12, wherein:

the set of CDAC units comprises a plurality of sub-sets of CDAC units;

for at least one of the CDAC units per sub-set, a given capacitor of the array of capacitors is configured to be unswitched dependent on the digital values and is a variable capacitor, and the control circuitry is configured to control the capacitance of the at least one variable capacitor per sub-set, optionally in the same way per sub-set, to configure the set of CDAC units into each of the plurality of different test configurations in turn; and/or for at least one of the CDAC units per sub-set, the capacitors of the array which are configured to be individually-switched are configured so that, when switched, a voltage level at one of the terminals of the capacitor concerned changes by an amount defined by a voltage level of a reference voltage signal, and the control circuitry is configured to control the voltage level of the reference voltage signal for the at least one of the CDAC units per sub-set, optionally in the same way per sub-set, to configure the set of CDAC units into each of the plurality of different test configurations in turn.

15. Mixed-signal circuitry comprising:

a capacitive digital-to-analogue converter, CDAC, unit for carrying out digital-to-analogue conversion operations to convert respective digital values into corresponding analogue values; and control circuitry, wherein:

the CDAC unit comprises an array of capacitors at least some of which are configured to be individually-switched dependent on the digital values; and the control circuitry is configured to carry out a calibration operation comprising:

determining the gain of the CDAC unit based on the digital values and the corresponding analogue values it generates; and whilst determining the gain of the ADC unit, adjusting the determined gain towards or to a target value, wherein:

a given capacitor of the array of capacitors is configured to be unswitched dependent on the digital values, and the control circuitry is configured to adjust the determined gain by adjusting the capacitance of the variable capacitor; and/or the capacitors of the array which are configured to be individually-switched are configured so that, when switched, a voltage level at one of the terminals of the capacitor concerned changes by an amount defined by a voltage level of a reference voltage signal, and the control circuitry is configured to adjust the determined gain by adjusting the voltage level of the reference voltage signal.

16. Mixed-signal circuitry according to claim 15, wherein:

the CDAC unit is configured to convert a full-scale digital value into a corresponding analogue value;

the control circuitry is configured to determine the gain of the CDAC unit based on digital values having a test digital value; and the test digital value is:

the same as the full-scale digital value; or between 50% and 95% of the full-scale digital value, or between 80% and 90% of the full-scale digital value.

17. Mixed-signal circuitry according to claim 15, comprising a plurality of said CDAC units, wherein the control circuitry is configured to carry out a said calibration operation for each of the CDAC units, optionally wherein the target value is the same for each of the CDAC units.

* * * * *